(12) United States Patent
Nozaki et al.

(10) Patent No.: US 6,770,417 B2
(45) Date of Patent: Aug. 3, 2004

(54) NEGATIVE RESIST COMPOSITION, PROCESS FOR FORMING RESIST PATTERNS, AND PROCESS FOR MANUFACTURING ELECTRON DEVICE

(75) Inventors: Koji Nozaki, Kawasaki (JP); Ei Yano, Kawasaki (JP); Miwa Kozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 143 days.

(21) Appl. No.: 09/935,832

(22) Filed: Aug. 24, 2001

(65) Prior Publication Data

US 2002/0058197 A1 May 16, 2002

(30) Foreign Application Priority Data

Sep. 1, 2000 (JP) .......................................... 2000-266041
Jun. 4, 2001 (JP) .......................................... 2001-168630

(51) Int. Cl.$^7$ ............................................... G03F 7/004
(52) U.S. Cl. ..................... 430/270.1; 430/325; 430/905
(58) Field of Search .............................. 430/270.1, 325, 430/905

(56) References Cited

U.S. PATENT DOCUMENTS

| 5,916,995 A | | 6/1999 | Park et al. .................. 528/104 |
| 5,998,092 A | * | 12/1999 | McCulloch et al. ..... 430/270.1 |
| 6,027,856 A | | 2/2000 | Nozaki et al. ........... 430/281.1 |
| 6,159,653 A | * | 12/2000 | Malik et al. ............. 430/270.1 |
| 2001/0053496 A1 | * | 12/2001 | Adams |

FOREIGN PATENT DOCUMENTS

| JP | A-6-27673 | 2/1994 |
| JP | 11-305436 | 5/1999 |
| JP | A-11-305436 | 11/1999 |
| JP | A-11-311860 | 11/1999 |

* cited by examiner

*Primary Examiner*—Rosemary Ashton
(74) *Attorney, Agent, or Firm*—Arent Fox Kintner Plotkin & Kahn PLLC

(57) ABSTRACT

A negative resist composition comprises at least a constituent component which has a vinyl ether structure protected with an acetal in a molecule thereof. In the formation of negative resist patterns, an aqueous basic solution can be used without swelling.

37 Claims, 5 Drawing Sheets

NEGATIVE RESIST COMPOSITION, PROCESS FOR FORMING RESIST PATTERNS, AND PROCESS FOR MANUFACTURING ELECTRON DEVICE

CROSS-REFERENCE TO RELATED APPLICATIONS

This application is based upon and claims priorities of Japanese Patent Application No. 2000-266041, filed Sep. 1, 2000, and No. 2001-168630, filed Jun. 4, 2001, the contents being incorporated herein by reference.

BACKGROUND OF THE INVENTION

1. Field of the Invention

The present invention relates to a resist composition and, more particularly, to a negative resist composition capable of being developed with an aqueous basic solution, a process for forming a resist pattern using the resist composition, and a process for manufacturing an electron device.

2. Description of the Related Art

LSI and VLSI have come to be used practically in recent years accompanying the process of higher levels of integration of semiconductor integrated circuits, and the minimum line width of the wiring pattern has reached the submicron order. Consequently, it is become essential to establish hyperfine machining technologies. In the field of lithography, as a means of responding to the above requirements, ultraviolet rays as the exposure light source have changed to far-ultraviolet rays having shorter wavelengths, and at the same time, considerable research has been conducted on improvements in the exposure methods using said far-ultraviolet rays as the exposure source. With this research, in the field of resist materials as well, there is a need to develop materials which combine lower absorption of light at the shorter wavelengths described above, have favorable sensitivity and have high tolerance to dry etching.

Described in more detail, research has been actively conducted on photolithography using a krypton fluoride excimer laser (wavelength: 248 nm, abbreviated as KrF) as a new type of exposure light source in the manufacturing process of semiconductor devices, and practical application has already begun. In addition, a resist composition using a concept referred to as chemical amplification has already been proposed by H. Ito, et al. of the IBM Corporation of the USA as a resist having high sensitivity and high resolution and being compatible with such short wavelength light sources (see, for example, J. M. J. Frechet et al., Proc. Microcircuit Eng., 260 (1982), H. Ito et al., Digest of Technical Papers of 1982 Symposium on VLSI Technology, 86 (1983), H. Ito et al., "Polymers in Electronics", ACS Symposium Series 242, T. Davidson ed., ACS, 11 (1984), and U.S. Pat. No. 4,491,628 (1985)). As can be easily understood from the above-mentioned references, the basic concept of this type of resist composition is to improve the apparent quantum yield by causing a catalytic reaction within the resist film to thereby increase the sensitivity and resolution of the resist composition.

In looking at the example of a chemically amplified, positive resist in which a photo acid generator (PAG), which has the effect of generating acid by light, is added to poly(t-butoxycarbonyloxystyrene) (t-BOCPVP), on which a broad range of research has been conducted thus far, at the exposed portion of the resist, protective groups in the form of t-BOC groups are deprotected by heating after exposure, namely so-called "PEB (post-exposure baking)", resulting in butene and carbon dioxide. The protonic acid formed during deprotection of t-BOC serves as a catalyst which causes the above-mentioned protective group deprotection reaction to proceed along the chain, thereby resulting in a considerable change in the polarity of the exposed portion. Accordingly, a resist pattern can be formed by selecting an appropriate developer which is able to accommodate the large change in polarity of the exposed portion.

More recently, an argon fluoride excimer laser (wavelength: 193 nm, abbreviated as ArF) having a shorter wavelength was expected to be used as the exposure light source for manufacturing further advanced high-integration semiconductor devices such as 1 GbitDRAM devices. However, a conventionally used phenol resin can not be used as a base resin because it strongly absorbs light at the short wavelength of ArF. It is therefore essential to change the base resin of the resist composition. Thus, there is a pressing need to develop a resist which can be used with short wavelengths.

Heretofore, a positive resist has actively been developed as the chemically amplified resist which can be applied at the wavelength of ArF (see, for example, K. Nozaki et al., Chem. Mater., 6, 1492 (1994), K. Nakano et al., Proc., SPIE, 2195, 194 (1994), R. D. Allen et al., Proc. SPIE, 2438, 474 (1994), Japanese Unexamined Patent Publication (Kokai) No. 9-90637, K. Nozaki et al., Jpn. J. Appl. Phys., 35, L528 (1996), K. Nozaki et al., J. Photopolym. Sci. Technol., 10 (4), 545-550 (1997)). Actually, there were few reports on a single-layer chemically amplified negative resist and almost all of them were reports on a crosslinking type resist. In the crosslinking type resists disclosed in A. Katsuyama et al., Abstracted Papers of Third International Symposium on 193 nm Lithography, 51 (1997), Maeda et al., Collected Preliminary Manuscript No. 2,647 (3a-SC-17) (1997) of the 58th Applied Physical Society, T Naito et al., Proc. SPIE, 3333, 503 (1998), Japanese Unexamined Patent Publication (Kokai) No. 2000-122288, and Japanese Unexamined Patent Publication (Kokai) No. 2000-147769, the molecular weight is enhanced by utilizing the crosslinking reaction of the exposed portion to form a difference in solubility in developer between the exposed portion and the non-exposed portion, and thus patterning is conducted. Therefore, limitations on hyperfine machining technologies, due to swelling of the pattern, could not be avoided.

Also a single-layer chemically amplified negative resist using intramolecular lactonization utilizing a hydroxycarboxylic acid structure (see, for example, Y. Yokoyama et al., J. Photopolym. Sci. Technol., 13 (4), 579 (2000)) and a change in polarity due to pinacol rearrangement) (see, for example, S. Cho et al., Proc. SPIE. 3999, 62 (2000)) has recently been reported. However, the use of intramolecular lactonization causes a problem in which high contrast is not easily obtained because of comparatively small change in polarity, while the use of pinacol rearrangement causes problems such as poor adhesion to the substrate due to fluorine and poor storage stability due to maleic anhydride, and thus single-layer chemically amplified negative resists are still imperfect. Although the present inventors have previously developed a single-layer chemically amplified negative resist using a change in polarity due to the intramolecular protection reaction (see, for example, Japanese Unexamined Patent Publication (Kokai) No. 11-311860 and Japanese Unexamined Patent Publication (Kokai) No. 11-305436), there was a problem that high sensitivity is not easily obtained because of the intramolecular reaction.

A negative resist is required when using a phase-shift mask as a super resolution technology which has recently been researched actively and a mask which projects an optical image and is called a Levenson type mask (expected to be used as a technique to obtain definition at an exposure wavelength or lower), and a negative resist is also strongly required in the case of ArF exposure. It is considered that these masks are applied when a definition of 130 nm or lower is required using ArF as a light source. Thus, there is currently a pressing need to develop a resist which can be used without causing swelling.

SUMMARY OF THE INVENTION

In order to solve the technical problems of the prior art as described above, an object of the present invention is to provide a novel negative resist composition which allows the use of an aqueous basic solution as the developer and is capable of forming a hyperfine pattern which has a sensitivity suited for practical use and is free from swelling.

Another object of the present invention is to provide a novel resist composition which can be exposed in the deep ultraviolet wavelength region as in the case of a KrF or ArF excimer laser and also has excellent resistance to dry etching.

A still another object of the present invention is to provide a novel resist composition which is capable of forming a hyperfine pattern having both high sensitivity, high contrast and high resolution by enhancing a difference in polarity between the exposed portion and the non-exposed portion.

A further object of the present invention is to provide a useful process using the resist composition of the present invention.

A still further object of the present invention is to provide a process for forming a resist pattern using the resist composition of the present invention.

Another object of the present invention is to provide a process for manufacturing various electronic devices, including semiconductor devices such as LSICs or VLSICs and magnetic recording heads such as MR heads, using the resist composition of the present invention.

These and other objects of the present invention will be apparent from the following detailed description.

As a result of earnest research to solve the above-mentioned problems, the present inventors have found that it is important to use, as a base resin, a film-forming polymer which has an alkali-soluble group and is soluble in an aqueous basic solution, and use a vinyl ether structure protected with an acetal in combination with the film-forming polymer in a chemically amplified resist composition.

The present invention provides a negative resist composition comprising at least a constituent component which has a vinyl ether structure protected with an acetal (acetal-protected vinyl ether structure) in its molecule.

In the negative resist composition of the present invention, the constituent component having an acetal-protected vinyl ether structure can take various forms, but is preferably a film-forming polymer which is soluble in an aqueous basic solution and has an alkali-soluble group, and which contains the acetal-protected vinyl ether structure in the side chain thereof. In such a case, the negative resist composition of the present invention preferably comprises a film-forming polymer and a photo acid generator capable of generating an acid which can react with the alkali-soluble group after the acetal-protected vinyl ether structure pro- duces the deacetalization reaction when decomposed as a result of absorption of imaging radiation, and the negative resist composition itself is soluble in an aqueous basic solution and the exposed portion becomes insoluble in an alkali after exposure.

The constituent component having an acetal-protected vinyl ether structure may be a compound containing the acetal-protected vinyl ether structure in its molecule. In such a case, the negative resist composition of the present invention preferably comprises a combination of the compound containing an acetal-protected vinyl ether structure and a photo acid generator capable of generating an acid which can react with the alkali-soluble group after the acetal-protected vinyl ether structure produces the deacetalization reaction when decomposed as a result of absorption of imaging radiation, and the negative resist composition itself is soluble in an aqueous basic solution and the exposed portion becomes insoluble in an alkali after exposure.

The present invention also provides a process, for forming a resist pattern, which comprises the following steps of:
  applying the negative resist composition of the present invention on a to-be-treated substrate;
  selectively exposing the formed resist film to imaging radiation capable of provoking decomposition of a photo acid generator of the resist composition, and
  developing the exposed resist film with an aqueous basic solution.

The present invention also provides a process for manufacturing an electronic device, which comprises the step of selectively removing an underlying to-be-treated substrate using a resist pattern, formed from the negative resist composition of the present invention, as a masking means to form a predetermined functional element layer. As used herein, the term "functional element layer" means those contained in the electronic device as a constituent feature and refers to an arbitrary patterned layer and others capable of contributing to the production of a function of the electron device, as described in detail below.

The process for manufacturing the electron device of the present invention preferably comprises the following steps of:
  applying the negative resist composition on a to-be-treated substrate;
  selectively exposing the formed resist film to imaging radiation capable of provoking decomposition of a photo acid generator of the resist composition,
  developing the exposed resist film with an aqueous basic solution to form a resist pattern; and
  selectively removing the underlying to-be-treated substrate by etching using the resist pattern as a masking means to form a predetermined functional element layer.

Furthermore, in the process for forming a resist pattern and the process for manufacturing an electron device according to the present invention, the exposure step in the formation of the resist pattern is preferably carried out through a phase shift mask.

DESCRIPTION OF THE PREFERRED EMBODIMENTS

Figure 1A:
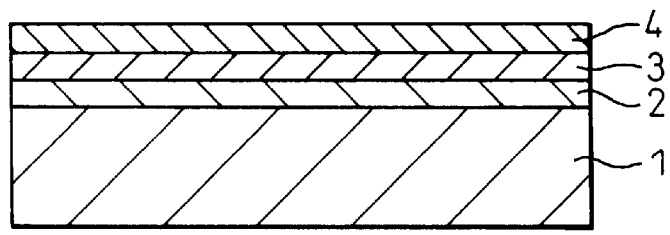
FIGS. 1A, 1B, 1C, 1D, 1E and 1F are cross-sectional views which show, in order, the manufacturing processes of the MOS transistor according to the present invention.

As can be easily understood from the detailed description below, the negative resist composition, the process for forming a resist pattern and the process for manufacturing an electron device according to the present invention can be carried out in various preferred embodiments.

In one aspect thereof, the present invention is directed to a negative resist composition, which can be developed with an aqueous basic solution, comprising a film-forming polymer, which has an alkali-soluble group and is soluble in an aqueous basic solution, the film-forming polymer containing a vinyl ether structure protected with an acetal (acetal-protected vinyl ether structure), and a photo acid generator capable of generating an acid which enables the acetal-protected vinyl ether compound to protect the alkali-soluble group when decomposed as a result of absorption of imaging radiation, wherein the acetal-protected vinyl ether structure has a partial structure represented by any one of the following formulas (I) to (III).

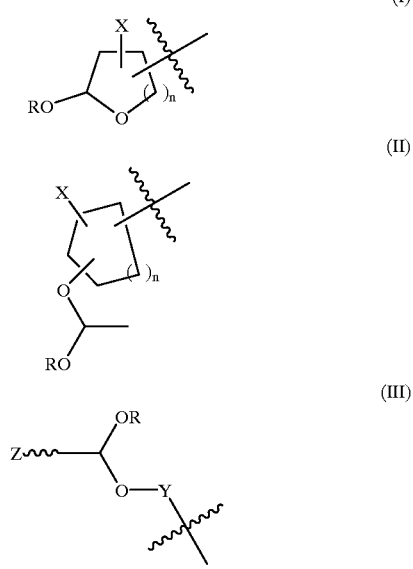

In the formulas described above,

X represents a hydrogen atom or an arbitrary substituent. The arbitrary substituent X may be substituted or unsubstituted. Examples of suitable substituent include an alkyl group (e.g. a methyl group, an ethyl group, a propyl group, etc.), an aryl group (e.g. a phenyl group, etc.) and an alkenyl group. If necessary, the substituent X itself may be bonded with an additional vinyl ether structure protected with an acetal. In that case, the acetal-protected vinyl ether structure can be bonded at an arbitrary position other than the 1- and 2-positions.

Y and R each represents an arbitrary hydrocarbon group and these hydrocarbon groups may be straight-chain, branched chain or cyclic group, or may be substituted or unsubstituted. Examples of suitable hydrocarbon group include alkyl group (e.g. methyl group, ethyl group, propyl group, etc.), aryl group (e.g. phenyl group, etc.) and alkenyl group.

Z represents a hydrogen atom or an arbitrary substituent, for example, an alkyl group, an aryl group or an alkenyl group. The substituent Z may be substituted or unsubstituted. If necessary, the substituent Z itself may be bonded with an additional vinyl ether structure protected with an acetal. The substituent Z and the substituent X may be the same.

n represents the number of carbon atoms which constitute a ring, and is an integer of 1 to 6.

The acetal-protected vinyl ether structure described above can be bonded at an arbitrary position of the film-forming polymer. Such an acetal-protected vinyl ether structure can be present at an arbitrary position of the film-forming polymer as long as it does not exert an adverse influence on the operation and effect of the present invention.

In the negative resist composition of the present invention, the film-forming polymer itself may be used as "a constituent molecule having an acetal-protected vinyl ether structure in a molecule" after incorporating the acetal-protected vinyl ether structure into the polymer as described above, and/or a combination of the acetal-protected vinyl ether structure and the film-forming polymer may be used as one component (additive). This negative resist composition is a negative resist composition, which comprises the film-forming polymer and a photo acid generator capable of generating an acid which can react with the alkali-soluble group after the acetal-protected vinyl ether structure produces the deacetalization reaction when decomposed as a result of absorption of imaging radiation, and which itself is soluble in an aqueous basic solution, wherein the exposed portion becomes insoluble in an alkali after exposure.

The present invention relates to a chemically amplified resist composition for forming a negative resist pattern on a to-be-treated substrate, which can be developed by an aqueous basic solution. As described above, this resist composition contains:

(a) a film-forming polymer (base resin) which has an alkali-soluble group and which itself is soluble in an aqueous basic solution, (b) a constituent component having a vinyl ether structure protected with an acetal (acetal-protected vinyl ether structure) in its molecule (the film-forming polymer may also serves as this constituent component, or the constituent feature may be a compound having an acetal-protected vinyl ether structure, which is independent of the film-forming polymer), and (c) a PAG (photo acid generator) capable of generating an acid which enables the constituent component (b) having a vinyl ether structure to protect the alkali-soluble group when decomposed as a result of absorption of imaging radiation. The acetal-protected vinyl ether structure of the constituent component (b) has preferably a structure represented by any one of the above formulas (I) to (III).

A mechanism of chemical amplification in the resist composition of the present invention will now be described by way of a film-forming polymer having an acetal-protected vinyl ether structure.

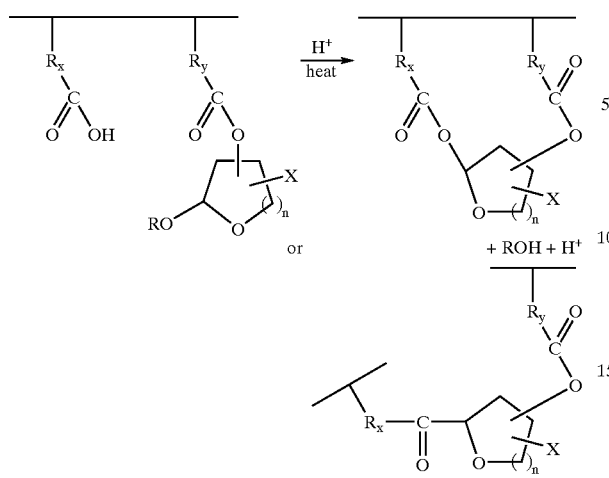

When exposed to imaging radiation after formation of the resist film, the PAG in the resist composition absorbs the radiation to generate an acid. Then, when the resist film after exposure is heated, the previously generated acid enables the intramolecular or intermolecular esterification reaction to process at the exposed portion of the resist film, and thus the alkali solubility of the polymer disappears.

In the resist composition of the present invention, an alkali-soluble group is incorporated into the film-forming polymer used as a base resin, and a vinyl ether structure capable of easily protecting the alkali-soluble group by heating in the presence of an acid catalyst represented by the formulas (I) to (III). Furthermore, high sensitivity can be achieved by chemical amplification capable of generating protonic acid by means of the protecting reaction. Since the alkali-soluble group disappears (converted into an ester by the above reaction scheme) after the functional group was protected, the exposed portion of the resist film becomes insoluble in an alkali and, therefore, a negative pattern can be formed after developing with an aqueous basic solution. Since a pattern is formed by utilizing a change in polarity caused in the polymer in the present invention, a pattern free from swelling is obtained.

The film-forming polymer used as the base resin in the resist composition of the present invention is not specifically limited as far as it has an alkali-soluble group and is soluble in an aqueous basic solution, that is, it is soluble in alkali. Preferred is a polymer wherein at least one of monomer units constituting the polymer is a (meth)acrylate monomer unit (e.g. an acrylate and a methacrylate monomer unit), a vinylphenol monomer unit, an N-substituted maleimide monomer unit, a styrene monomer unit, or a monomer unit having a polycyclic alicyclic hydrocarbon moiety (e.g. norbornene). More preferred is a polymer wherein at least one of the monomer units is a monomer unit having a structure (e.g. an adamanthyl group and a norbornyl group) in its polycyclic alicyclic hydrocarbon moiety. Such a film-forming polymer may be a silicon-containing polymer having an alkali solubility. Furthermore, such a film-forming polymer may be a homopolymer, or a copolymer such as two-component copolymer or three-component copolymer.

In case the above-described alkali-soluble polymer is in the form of a copolymer, the monomer unit, which is polymerized with the monomer unit having an alkali solubility, may have any structure as far as the polymer can maintain an appropriate alkali solubility to the developer. Furthermore, the alkali-soluble polymer may be in the form of a three-component copolymer as far as the polymer can maintain an appropriate alkali solubility, and such a combination is also preferred. In this case, the polymer may contain a second monomer unit having a weak alkali-soluble group, in addition to a first monomer unit having an alkali-soluble group, and such a combination is also preferred. The alkali-soluble polymer may be a silicon-containing polymer and composed of plural units as long as the polymer maintains the alkali solubility, and the polymer may also contain a unit having a weak alkali-soluble group and such a combination is also preferred.

The case where the alkali-soluble polymer can take the form of a three-component copolymer will now be further described. In such a case, the first monomer unit of the copolymer can have a strong alkali-soluble group such as carboxylic acid and a second monomer unit can have a weak alkali-soluble group such as a lactone ring structure, an acid anhydride or an imide ring structure. In such a case, it becomes easy to control an alkali dissolution rate of the base resin to a preferred value by controlling the content of the strong alkali-soluble group and the weak alkali-soluble group. The third monomer unit can have a functional group with etching resistance and is very suited for use as a resist.

In the alkali-soluble polymer of the present invention, the content of the monomer unit having an alkali-soluble group is not specifically limited as far as the resin itself exhibits an appropriate alkali solubility. In the case of the polymer consisting of a two- or multi-component monomer, for example, the content of the monomer unit having an alkali-soluble group is preferably within a range from 5 to 95 mol %, and more preferably from 30 to 70 mol %, in order to achieve an appropriate alkali dissolution rate which can be realized for a negative resist (dissolution rate in a 2.38% TMAH developer is within a range from 100 to 10000 Å/second). When the content of the monomer is smaller than 5 mol %, it becomes impossible to perform satisfactory patterning because of poor alkali solubility in the case of the alkali-soluble group, the acidity of which is weaker than that of carboxylic acid. On the other hand, when the content of the monomer is larger than 95 mol %, since the alkali solubility is too strong, the dissolution rate in an aqueous basic solution is too large to perform patterning in the case of the alkali-soluble group, the acidity of which is stronger than that of carboxylic acid. Accordingly, it is desired to appropriately control the content of the monomer unit by the acidity of the alkali-soluble group to be used.

In the alkali-soluble polymer, the content of the monomer having an acetal-protected vinyl ether structure is not specifically limited as far as the resin itself exhibits an appropriate alkali solubility and can perform satisfactory patterning, but is preferably controlled to the content where the reaction can be carried out so that the dissolution rate in a 2.38% TMAH developer after heating (PEB) followed by exposure is within a range from about 0 to 40 Å/second. In the case of the polymer consisting of a two- or multi-component monomer, for example, the content of the monomer unit having an alkali-soluble group is preferably within a range from 5 to 95 mol %, and more preferably from 30 to 70 mol %.

As described above, a compound having an acetal-protected vinyl ether structure is preferably used as an additive in the resist. In such a case, the content of the compound is preferably within a range from 1 to 80% by weight, and more preferably from 10 to 40% by weight, relative to the above-described polymer having an appropriate alkali dissolution rate, though it depends strongly on the alkali dissolution rate of the film-forming polymer used as the base resin.

Describing the above more specifically, the alkali-soluble polymer used as the base resin in the resist composition of the present invention is not specifically limited as far as it satisfies the above-described conditions, especially conditions that it has an appropriate alkali dissolution rate. In order to obtain the dry etching resistance comparable to that of Novolak resist, a polymer of an acrylate or methacrylate monomer unit having a polycyclic alicyclic hydrocarbon compound in an ester group, a N-substituted maleimide polymer, a styrene polymer and a norbornene polymer are preferred. When using deep ultraviolet rays, especially a light source having a wavelength of 250 nm or shorter as the exposure light source, an acrylate polymer, a methacrylate polymer and a norbornene polymer can be advantageously used because of their important features such as small absorption of light having the wavelength. In other words, when using deep ultraviolet rays as the exposure light source, it is desired to use a polymer having a structure which contains neither an aromatic ring capable of drastically absorbing light in the deep ultraviolet region, nor chromophores having a large molar absorption coefficient such as conjugated double bonds.

Depending on the shape of the to-be-treated substrate and the required processing accuracy, dry etching resistance superior to Novolak resist is sometimes required. For example, it is the case where a step of the to-be-treated substrate makes it impossible to cope with a general single-layer resist. In such a case, hyperfine fabrication can be carried out by applying a process for manufacturing a two-layer resist comprising a lower layer resist for flattening, which has no photosensitivity, and a silicon-containing upper layer resist which has photosensitivity. As is well known, the two-layer resist process comprises patterning an upper layer resist, transferring the resulting resist pattern onto an underlying lower layer resist by etching, and hyper-fabricating a to-be-treated substrate using the resulting pattern, having a high aspect ratio, as a mask. In such a case, the alkali-soluble polymer used as the base resin in the resist composition of the present invention is preferably a silicon-containing polymer such as siloxane polymer, polysilane polymer or the like. when using deep ultraviolet rays, especially a light source having a wavelength of 250 nm or shorter as the exposure light source, a siloxane polymer and a polysilane polymer can be advantageously used because of their important features such as small absorption of light having the wavelength.

Moreover, when using an ArF excimer laser having a light exposure wavelength in an ultra-short wavelength region as the exposure light source, since the dry etching resistance and transparency at the wavelength (193 nm) are required, a polymer having an ester group containing a polycyclic alicyclic hydrocarbon structure (e.g. adamanthyl group and norbornyl group having high dry etching resistance), especially an acrylate polymer, a methacrylate polymer or a norbornene polymer is preferably used. The same may be applied to the silicon-containing polymer.

The molecular weight (weight-average molecular weight, Mw) of the above-described acrylate or methacrylate polymer and the other alkali-soluble polymer can vary widely, but is preferably within a range from 2,000 to 1,000,000, and more preferably from 3,000 to 50,000.

Examples of the alkali-soluble polymer which can be advantageously used in the practice of the present invention include, but are not limited to, the polymers represented by the following formulas. Furthermore, the letters j, k, l, m and n in the formulas respectively represent the number of monomer units (repeating units) required to obtain the above-described weight-average molecular weight. $R_1$ to $R_3$ respectively represent an arbitrary substituent, unless otherwise indicated, for example, a hydrogen atom, a halogen atom (e.g. chlorine, bromine, etc.), a lower alkyl group (e.g. a methyl group, an ethyl group, etc.) or a cyano group. They may be the same or different.

(1) Acrylate or methacrylate polymers represented by the following structural formula:

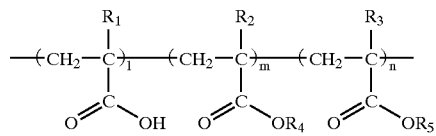

In the above structural formulas, $R_4$ represents a weak alkali-soluble group such as lactone ring, but a monomer unit having a weak alkali-soluble group is not an essential unit as far as the alkali dissolution rate exhibits an appropriate value for a base resin of a negative resist. $R_5$ represents a unit having a vinyl ether structure protected with an acetal.

A polymer having a structure represented by the following structural, which has an ester group having carboxylic acid as the alkali-soluble group, may be used, as a matter of course, in addition to the structure described above.

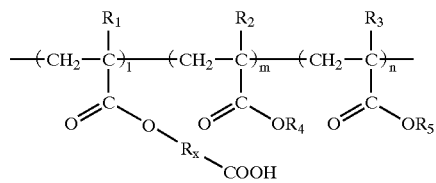

In the above structural formula, $R_4$ and $R_5$ are as defined above. $R_x$ can have an arbitrary structure, but preferably has a polycyclic alicyclic structure.

(2) Polymers having, as an alkali-soluble group, styrene units represented by the following structural formulas:

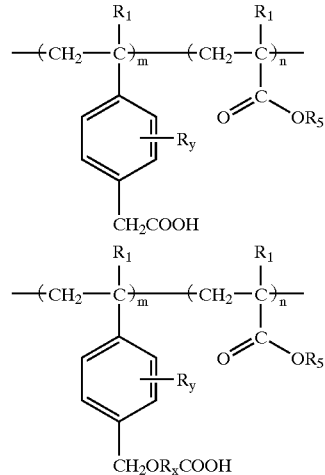

In the above structural formulas, Ry represents an arbitrary substituent. $R_x$ is preferably selected as described above.

(3) Polymers having, as an alkali-soluble group, a fumaric acid unit represented by the following structural formula:

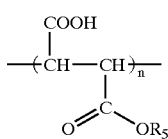

(4) Polymers having, as an alkali-soluble group, a vinylbenzoic acid unit represented by the following structural formulas:

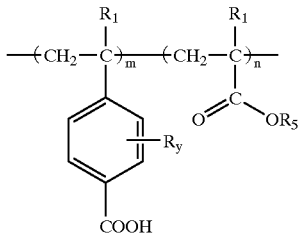

(5) Polymers having, as an alkali-soluble group, norbornane units and derivatives thereof represented by the following structural formulas:

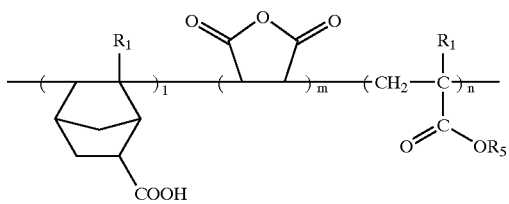

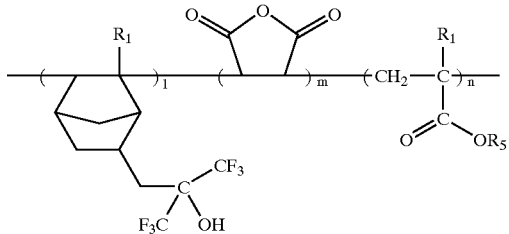

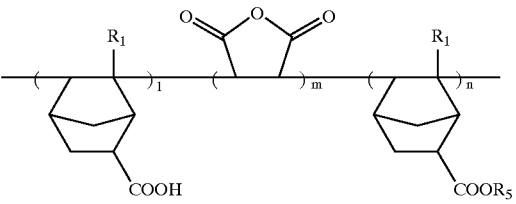

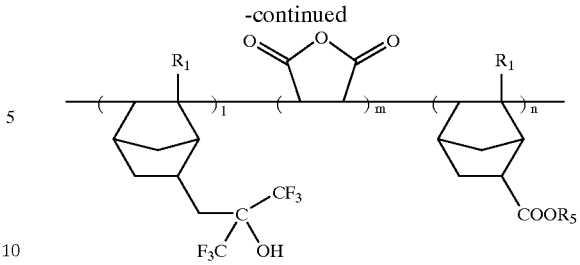

(6) Polymers having, as an alkali-soluble group, itaconic acid units represented by the following structural formulas:

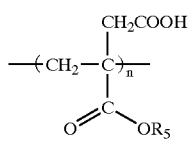 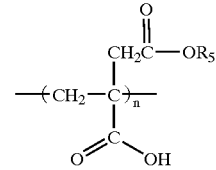

(7) Polymers having, as an alkali-soluble group, a maleic acid unit represented by the following structural formula:

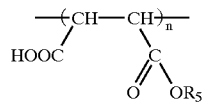

(8) Polymers having, as an alkali-soluble group, a vinylphenol unit represented by the following structural formula:

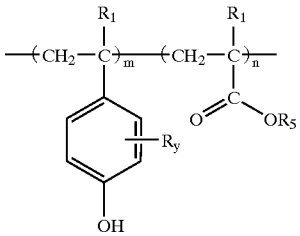

As described previously, an arbitrary copolymer including three- or multi-component copolymer may be formed by using these polymers in combination with other appropriate monomer units.

(9) Silicon-containing polymers having, as an alkali-soluble group, siloxane units represented by the following structural formulas:

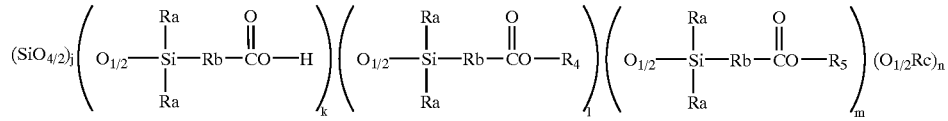

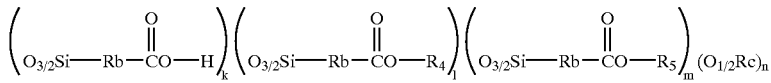

In the above formulas, $R_a$ represents a monovalent hydrocarbon group —$C_nH_{2n+1}$ wherein n represents an integer of 1 to 3 such as methyl group, $R_b$ represents a divalent hydrocarbon group —$C_nH_{2n}$ wherein n represents an integer of 2 to 5 such as ethylene group, and $R_c$ represents a hydrogen atom, a monovalent hydrocarbon group —$C_nH_{2n+1}$ wherein n represents an integer of 1 to 3 such as methyl group, or a triorganosilyl group. As described above, $R_4$ in the formula represents a weak alkali-soluble group such as a lactone ring, but a monomer units having a weak alkali-soluble group is not an essential unit as far as the alkali dissolution rate exhibits an appropriate value for a base resin of a negative resist. $R_5$ represents a unit having a vinyl ether structure protected with an acetal.

If necessary, these silicon-containing polymers may have an arbitrary substituent other than those described above, similar to other useful alkali-soluble polymers. Alternatively, these silicon-containing polymers may have an arbitrary structure using in combination with other appropriate silicon-containing units.

The alkali-soluble polymer, which can be used in the present invention, includes those represented by the following formulas:

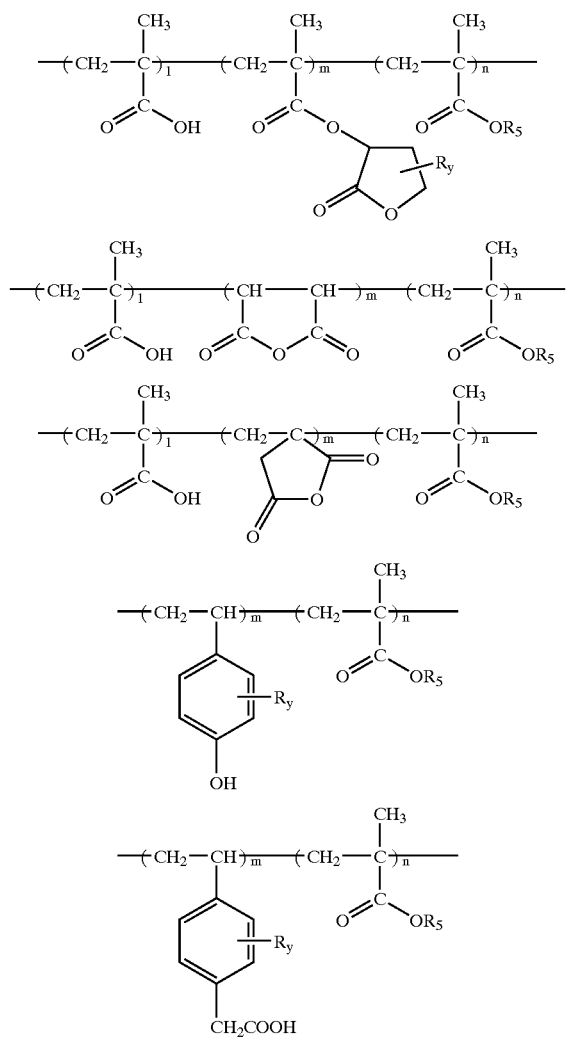

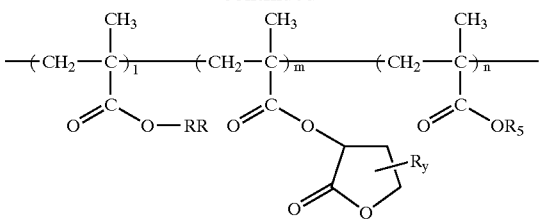

In the above formulas, PR represents substituents represented by the following formulas:

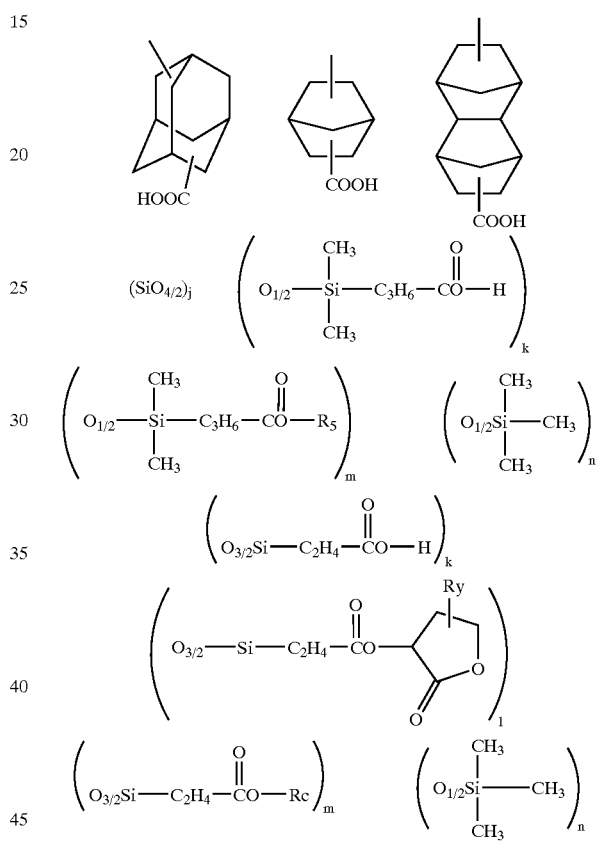

In the above formulas, $R_5$, $R_y$ and $R_c$ are as defined above.

Note that the alkali-soluble polymers described above are considered to be illustrative and not restrictive to these structures. In the above formulas, $R_y$ and $R_5$ are as defined above. In the above formulas, the functional groups, which can be advantageously used as $R_5$, include those of the following structure:

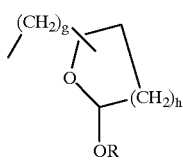

The functional groups represented by the above formula are cyclic ethers, and g and h in the formula are integers of 1 to 6 and R is as defined above.

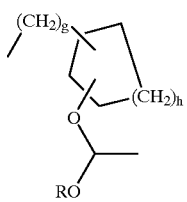

The functional groups represented by the above formula are alicyclic ethers and a so-called polycyclic aliphatic group of consisting of the combined plural alicyclic structures may be used as a matter of course. In addition, g, h and R in the formula are as defined above.

The alkali-soluble polymer used in the present invention can be prepared by using a polymerization process generally used in polymer chemistry. For example, it can be advantageously prepared by heating a predetermined monomer component in the presence of AIBN (2,2'-azobisisobutyronitrile) as a free radical initiator. The alkali-soluble polymer other than the methacrylate polymer can be advantageously prepared by a conventional process.

It has been well known that the methacrylate polymer has high transparency in a deep ultraviolet region. When a structure containing no chromophores having a large molar absorption coefficient at a wavelength within a range from 190 to 250 nm is selected in the structure of the resin described above and the vinyl ether compound or epoxy compound to be added, a high-sensitivity resist capable of advantageously coping with exposure using deep ultraviolet rays can be prepared by using them in combination with an appropriate amount of a PAG (photo acid generator). Furthermore, since the siloxane polymer has higher transparency in the deep ultraviolet region, a high-sensitivity resist capable of advantageously coping with exposure using deep ultraviolet rays can be prepared, similar to the methacrylate polymer.

The alkali-soluble polymers described above contain a vinyl ether structure protected with an acetal and the alkali-soluble group is protected with the acid catalytic reaction. Since protonic acid can be regenerated by the protection reaction, high sensitivity can be achieved. Since the alkali-soluble group disappears after the protection reaction, the exposed portion of the resist film becomes insoluble in an aqueous basic solution, thus obtaining a negative pattern wherein the non-exposed pattern was dissolved by developing. There is such an advantage as to obtain a pattern which is free from swelling because pattern formation is carried out utilizing the change in polarity produced in the based resin.

In the chemically amplified resist of the present invention, the photo acid generator (PAG) used in combination with the film-forming polymer as described above may be a photo acid generator generally used in resist chemistry, namely a substance which generates protonic acid when irradiated with radiation such as ultraviolet rays, far ultraviolet rays, vacuum ultraviolet rays, electron beam, X-rays or laser light. Examples of PAG which can be used in the present invention include, but are not limited to, those shown below.

(1) Onium salts represented by the following formulas:

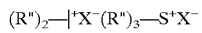

In the above formula, R" represents a substituted or unsubstituted aromatic ring or alicyclic group, and X represents $BF_4$, $PF_6$, $AsF_6$, $SbF_6$, $CF_3SO_3$ or $ClO_4$.

(2) Sulfonate esters represented by the following formulas:

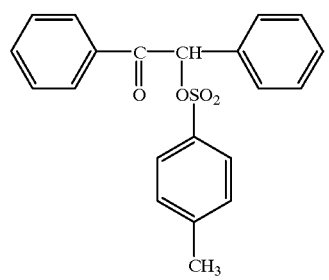

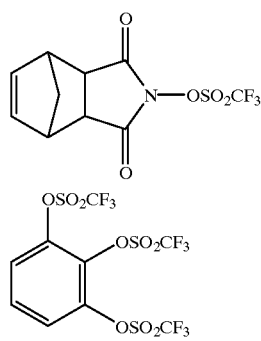

(3) Halides represented by the following formulas:

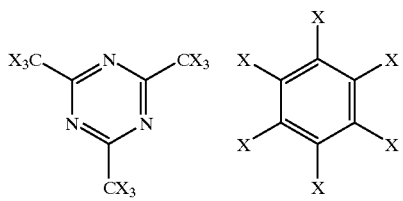

X represents Cl, Br or other halogens.

If necessary, photo acid generators disclosed in Japanese Unexamined Patent Publication (Kokai) Nos. 9-90637 and 9-73173 may be used, in addition to these photo acid generators.

These photo acid generators can be used in different amounts in the resist composition of the present invention. The amount of PSG depends upon the strength of the acid generated after exposing to the exposure light source, but is preferably within a range from 0.1 to 50% by weight (based on the weight of the polymer), and more preferably from 1 to 15% by weight. In the resist composition of the present invention, it is preferred to take into consideration the structures of the polymer and the PAG as well as the amount of the PAG so that the absorbance at the exposure wavelength of the resist composition of the present invention is 1.75 $\mu m^{-1}$ or less.

The resist composition of the present invention can be advantageously used, in the form of a resist solution, by dissolving the above-mentioned alkali-soluble polymers, vinyl ether compounds (epoxy compound may also be added) and photo acid generators in a suitable organic solvent. Examples of useful organic solvents for preparing a resist solution include, but are not limited to, ethyl lactate, methyl amyl ketone, methyl-3-methoxypropionate, ethyl-3-ethoxypropionate and propylene glycol methyl ether acetate. When using a silicon-containing polymer as the alkali-soluble polymer, the polymer can be provided in the form of a solution by dissolving it in an organic solvent selected from the group consisting of methyl isobutyl ketone, n-butyl ether, or a mixture thereof, in addition to various organic solvents described above. These solvents may be used alone or in combination, if necessary. Although there are no particular limitations on the amounts of these solvents used, it is preferable to use an amount which is sufficient for obtaining suitable viscosity and the desired resist film thickness in a coating method such as spin coating, a typical coating method.

In addition to the above-mentioned solvents (referred to as a "main solvents"), auxiliary solvents may also be used in the resist solution of the present invention as necessary. Although the use of an auxiliary solvent may not be required depending on the solubility of the solute, in the case of using a solute having low solubility, it is preferred to add 1 to 30% by weight of auxiliary solvent, and more preferably 10 to 20% by weight, relative to the main solvent. Examples of useful auxiliary solvents include, but are not limited to, butyl acetate, y-butyrolactone and propylene glycol methyl ether. These auxiliary solvents may be used alone or in combination, if necessary.

In the resist composition of the present invention, the absorbance at the wavelength (180 to 300 nm) of the exposure light source is preferably 1.75 $\mu m^{-1}$ or less. According to the resist composition having such an absorbance, sufficient patterning characteristics can be obtained.

In another aspect thereof, the present invention is directed to a process for forming a negative resist pattern, which comprises the following steps of:

applying the negative resist composition of the present invention on a to-be-treated substrate;

selectively exposing the formed resist film to imaging radiation capable of provoking decomposition of a photo acid generator of the resist composition, and developing the exposed resist film with an aqueous basic solution.

In the process for forming a resist pattern according to the present invention, the resist film formed on the to-be-treated substrate is preferably subjected to a heating treatment before and after subjecting to the selective exposure step. In the present invention, the resist film is preferably subjected to the pre-baking treatment before exposure and then subjected to PEB (post-exposure baking treatment) after exposure and before developing. These heating treatments can be advantageously carried out by a conventional process.

The negative resist pattern of the present invention can be usually formed in the following procedure.

First, the resist composition of the present invention is applied on the to-be-treated substrate. The substrate can be a substrate normally used in semiconductor or other devices, several examples of which include a silicon substrate, a glass substrate, a non-magnetic ceramic substrate, a compound semiconductor substrate and an insulated crystal substrate such as alumina. In addition, additional layers, such as a silicon oxide film layer, a metal wiring layer, an interlayer insulating film layer or a magnetic film may be present on the substrate as necessary, and various types of wiring and circuits, etc. may be incorporated onto the substrate as well. Moreover, the substrate may be hydrophobically treated by a conventional process to improve the adhesion of the resist film to the same. A suitable example of a hydrophobic treatment agent is 1,1,1,3,3,3-hexamethyldisilazane (HMDS).

As described above, the resist composition can be applied to the substrate in solution. Coating of the resist solution can be carried out using conventional techniques such as spin coating, roll coating and dip coating, and spin coating is particularly useful. The thickness of the resist film is recommended to be within the range of about 0.1 to 200 $\mu m$, but a thickness of 0.1 to 1.5 $\mu m$ is recommended in the case of KrF or ArF exposure. Furthermore, the thickness of the formed resist film can vary widely depending upon factors such as the use of the particular resist film and so forth.

It is preferred that the resist film applied on the substrate is pre-baked at a temperature of about 60 to 180° C. for about 30 to 120 seconds before selectively exposing to imaging radiation. This pre-baking step can be carried out using a heating means routinely used in the resist process. Examples of suitable heating means include a hot plate, infrared heating oven and microwave heating oven.

Then, the pre-baked resist film is selectively exposed to imaging radiation with a conventional exposure device. Examples of suitable exposure device include commercially available ultraviolet (far ultraviolet, deep ultraviolet) exposure devices, X-ray exposure devices, electron beam exposure devices and excimer steppers. Exposure conditions can be suitably selected for each type of exposure. In the present invention in particular, excimer lasers (KrF laser having a wavelength of 248 nm, ArF laser having a wavelength of 193 nm, and $F_2$ laser having a wavelength of 157 nm) can be advantageously used as the exposure light source, as previously described. Furthermore, in the specification of the present application, whenever the term "radiation" is used, it means light or a beam from these various light sources.

This exposure step is advantageously carried out through a phase shift mask or a Levenson mask. When using these masks in combination with the negative resist of the present invention, a hyperfine pattern can be formed without causing swelling.

Next, post-exposure baking (PEB) is applied to the exposed resist film to cause the protective groups to undergo the deprotection reaction catalyzed by the acid. This post-exposure baking can be carried out in the same manner as the previously described pre-baking. For example, baking temperature is within a range from about 60 to 180° C. and the baking time is within a range from about 30 to 120 seconds. However, these conditions can be controlled by a desired pattern size, shape or the like.

After completion of PEB, the exposed resist film is developed with an aqueous basic solution as a developer. Conventional development devices, such as a spin developer, dip developer or spray developer can be used for this development. The aqueous basic solution which can be advantageously used as the developer is an aqueous solution of the hydroxide of a metal of the group I or II of the Periodic Table such as potassium hydroxide, or an aqueous solution of an organic base containing no metal ions, such as tetraalkylammonium hydroxide. More preferably, the aqueous basic solution is an aqueous solution of tetramethylammonium hydroxide (TMAH), tetraethylammonium hydroxide (TEAH) or the like. In addition, the aqueous basic solution may contain additives such as a surfactant to improve its developing effects. As a result of the development, the exposed portion of the resist film is dissolved and removed, resulting in only the non-exposed portion remaining on substrate 1 in the form of a negative resist pattern.

The present invention also provides a process for manufacturing an electron device using the negative resist composition, and the electronic device manufactured from the same. The term "electronic device" used herein means various electronic equipments including semiconductor devices and magnetic recording heads and is not limited to equipments having a specific structure. Examples of suitable electron device include, but are not limited to, an integrated circuit device, a magnetic sensor, a display device (e.g. LCD, PDP, organic EL, inorganic OL, etc.) and a functional device (e.g. SAW filter, etc.). The negative resist composition used herein include various resist compositions according to the present invention described previously with respect to various aspects.

The process for manufacturing an electron device of the present invention comprises the step of selectively removing an underlying substrate using the resist pattern, formed from the negative resist composition of the present invention, as a masking means to form a predetermined functional element layer. An etching process is preferably used to selectively remove the substrate.

As mentioned previously, in the formation of the resist pattern, the underlying substrate or thin film to be removed selectively by etching is also called generically as the "to-be-treated substrate". Namely, the to-be-treated substrate means all substrates or thin films to be subjected to etching in manufacturing of electronic devices such as semiconductor devices, magnetic recording heads and the like. Examples of suitable to-be-treated substrate include, but are not limited to, semiconductor substrates such as silicon substrate and GaAs substrate; insulating crystal substrates such as compound substrate and alumina ($Al_2O_3$); and various thin films made of metal silicides (e.g. PSG, TEOS, SiON, TiN, amorphous carbon, Al—Si, Al—Si—Cu, WSi, etc.), polysilicon (Poly-Si), amorphous silicon, $SiO_2$, Ga—As, and TiW.

Furthermore, (giant) magnetic resistance effect films such as Cu, Co, FeMn, NIFe and LaSrMnO also fall under the category of the to-be-treated substrate.

According to the process for manufacturing an electronic device of the present invention, although the to-be-treated substrate remains in the state of a patterned layer, such a patterned layer has predetermined operation and effect in an electron device including the same and, therefore, the patterned layer is called a "functional element layer" in the present specification.

The process for manufacturing an electron device of the present invention can be preferably carried out in accordance with the following steps of:

applying the negative resist composition of the present invention on a to-be-treated substrate;

selectively exposing the formed resist film to imaging radiation capable of provoking decomposition of a photo acid generator of the resist composition, developing the exposed resist film with an aqueous basic solution to form a resist pattern; and selectively removing the underlying to-be-treated substrate by etching using the resist pattern as a masking means to form a predetermined functional element layer.

As previously described, imaging radiation used in the exposure step of the resist film means all light sources used in the resist process in manufacturing of the semiconductor device and specific examples thereof include mercury lamps (e.g. g-rays, i-rays, etc.), KrF and ArF excimer lasers, electron beams, and X-rays. The excimer lasers are particularly preferred.

It is advantageous, to form a hyperfine pattern, to use a phase-shift mask or a Levenson type mask upon exposure.

According to the present invention, there is also provided an electronic device with a patterned layer (functional element layer) at an arbitrary position, the patterned layer being formed by selectively removing a to-be-treated substrate using, as a mask means, a resist pattern formed from the negative resist composition of the present invention.

Subsequently, the electronic device of the present invention and process for manufacturing the same will be described by reference to a semiconductor device and a magnetic recording head as an example.

The process for manufacturing a semiconductor device of the present invention can be preferably carried out in accordance with the following steps of:

applying the negative resist composition of the present invention on a to-be-treated substrate;

selectively exposing the formed resist film to imaging radiation capable of provoking decomposition of a photo acid generator of the resist composition, developing the exposed resist film with an aqueous basic solution to form a resist pattern; and selectively removing the underlying to-be-treated substrate by etching using the resist pattern as a masking means to form a predetermined functional element layer.

In the process for manufacturing a semiconductor device, the step of forming a resist film, the step of selectively exposing to radiation and the step of forming a resist pattern can be advantageously carried out in accordance with the previously described method for forming a resist pattern of the present invention.

The subsequent etching step can be carried out by wet etching or dry etching in accordance with a conventional technique. However, it is advantageously carried out by dry etching in view of further progress of hyperfine fabrication technologies and pollution controls in recent years. As well known, dry etching involves etching a treated substrate in a vapor phase. Examples of suitable dry etching include plasma etching such as reactive ion etching (RIE), reactive ion beam etching (RIBE) and ion beam etching. This dry etching can be carried out under predetermined conditions using a commercially available etching device.

Although the resist pattern formed according to the process of the present invention can normally be advantageously used as a mask for etching of an underlying substrate, that resist pattern may also be used as one functional element layer of a semiconductor device, such as an insulating film, provided it is able to satisfy predetermined requirements relating to characteristics and so forth.

As used herein, the term "semiconductor device" refers to an ordinary semiconductor device and is not specifically limited. As recognized in this technical field, a typical semiconductor device refers to an ordinary semiconductor main circuit or other related device such as an IC, LSIC or VLSIC.

Describing more specifically, a MOS transistor as a typical example of the semiconductor device can be manufactured in the following procedure.

First, a gate oxide film, a polysilicon film and a WSi film are sequentially formed on a silicon substrate. Formation of each of these thin films can be carried out by conventional thin film formation processes such as thermal oxidation process, chemical vapor deposition (CVD) and other processes.

Then, the resist composition of the present invention is applied on the WSi film to form the resist film having a predetermined thickness. This resist film is selectively irradiated with radiation suited for patterning, and then developed in an aqueous basic solution to remove the exposed portion by dissolving. More specifically, a series of steps described above can be carried out as described previously with respect to formation of the resist pattern.

To form a gate electrode structure, dry etching is carried out on the polysilicon film and the WSi film using the resulting resist pattern as a mask. After formation of the gate electrode comprising the polysilicon film and WSi film, phosphorous ions are injected by ion implantation to form an N⁻ diffusion layer having an LDD structure.

After removal of the resist film on the gate electrode, an oxide film is formed over the entire surface by the CVD process. Anisotropic etching is carried out on the formed CVD oxide film to form a side wall on the side wall of the gate electrode comprising the polysilicon film and the WSi film. Moreover, ion implantation is carried out using the WSi film and the sidewall as masks to form an N+diffusion layer. Then, the gate electrode is covered with the thermal oxide film.

Finally, an interlayer insulating film is formed over the entire surface of the uppermost layer of the substrate by the CVD process, and then selective etching is carried out by applying the resist composition of the present invention again to form a hole pattern (resist pattern) in the wiring forming portion. Moreover, the interlayer insulating layer underneath is etched using this resist pattern as the mask to open a contact hole. Aluminum (Al) wiring is then embedded in this contact hole to complete a hyperfine N-channel MOS transistor.

In addition to the semiconductor device described above, the present invention also includes a magnetic recording head as one embodiment of the electron device. By carrying out the resist process using the negative resist composition of the present invention, a high-performance and thin-film magnetic recording head can be provided. The magnetic recording head can be advantageously used in magnetic recording/reproducing devices such as magnetic disk device, magnetic tape device and the like.

The process for manufacturing a magnetic recording head of the present invention can be preferably carried out in accordance with the following steps of:

applying the negative resist composition of the present invention on a to-be-treated substrate;

selectively exposing the formed resist film to imaging radiation capable of provoking decomposition of a photo acid generator of the resist composition, developing the exposed resist film with an aqueous basic solution to form a resist pattern; and selectively removing the underlying to-be-treated substrate by etching using the resist pattern as a masking means to form a predetermined functional element layer.

The magnetic recording head will now be described. With recent progress of downsizing and higher recording density of magnetic recording/reproducing devices such as magnetic disk device, a head (so-called MR head) utilizing a magnetic resistance effect capable of converting a change of a signal magnetic field on a magnetic recording medium into a change of electrical resistivity has widely been used as a reproducing head of the devices. Among MR heads, a spin valve head utilizing a spin valve resistance effect has already been put into practice because it can be made comparatively easily and the change in electric resistivity in a low magnetic field is larger than that of the other MR head. The negative resist composition of the present invention can be advantageously used to form a hyperfine pattern with a thin film on a functional element constituting the head in manufacturing of various thin-film magnetic heads.

As well known, the spin valve head is made by electrically bonding a magnetic resistance effect film (spin valve film) to a spin valve film and is provided with a pair of electrodes which demarcate a signal detecting region and apply a signal detecting current to this signal detecting region, and a pair of vertical bias magnetic field applying layers which apply a vertical bias magnetic field to the spin valve film. The vertical bias magnetic field applying layer is formed from a hard magnetic thin film made of CoPt, CoPtCr or the like. By arranging the vertical bias magnetic field applying layer formed from the hard magnetic thin film on both sides or an upper side of the spin valve film at the portion other than a magneto-sensitive portion (signal detecting region) of the spin valve head, Barkhausen noise caused by domain wall displacement of a free magnetic layer of the spin valve film can be inhibited, thereby making it possible to obtain a noise-free and stable reproduced wave form.

Furthermore, the spin valve film is usually composed by sequentially laminating a free magnetic layer, a non-magnetic layer, a pinned magnetic layer and a regular antiferromagnetic layer on a base layer. With such a layer construction, the electric resistivity can be desirably varied by controlling an angle between magnetization directions of two magnetic layers (free magnetic layer and pinned magnetic layer) laminated through the non-magnetic intermediate layer.

Describing more specifically, the spin valve film is usually formed on an AlTiC substrate, namely a substrate made by forming an alumina film on the surface of a TiC substrate. A Ta film is used as a base layer, as the innermost layer, because the Ta film has an effect of imparting good crystallinity to the free magnetic layer. The Ta film and the other base layer can be formed by using conventional film forming processes such as a sputtering process, a deposition process, a chemical vapor deposition process (CVD process) and the like.

The free magnetic layer can be formed from any soft magnetic material. For example, a CoFe alloy used generally for forming the free magnetic layer may be used. The free magnetic layer is preferably made from a $(Co_yFe_{100-y})_{100-x}Z_x$ alloy [wherein Z represents an arbitrary element other than Co and Fe, preferably boron B or carbon C, and x and y each represents an atomic fraction (at %)] having a face centered cubic lattice structure, but the material is not limited thereto. Because it can provide a head having high output, high magneto-sensitivity and high heat resistance the free magnetic layer having a two-layer structure is preferred as compared with that having a single-layer structure in view of resulting characteristics. The free magnetic layer can be formed by using a conventional film forming process such as sputtering process.

The spin valve film preferably has such a construction that a non-magnetic intermediate layer is sandwiched between the free magnetic layer and a pinned magnetic layer described hereinafter. As the material of the non-magnetic intermediate layer, a non-magnetic metallic material such a copper (Cu) can be used. A Cu intermediate layer can also be formed by using a conventional film forming process such as sputtering process.

The pinned magnetic layer can be formed from any soft magnetic layer similar to the case of the free magnetic layer. Although a CoFe alloy may be used for formation of the pinned magnetic layer, the pinned magnetic layer is preferably formed from a $(Co_yFe_{100-y})_{100-x}Z_x$ alloy [wherein Z represents an arbitrary element other than Co and Fe, preferably boron B or carbon C, and x and y each represents an atomic fraction (at %)] having a face centered cubic lattice structure because it can provide a head having high output, high magneto-sensitivity and high heat resistance. The pinned magnetic layer can also be formed by using a conventional film forming process such as sputtering process.

On the pinned magnetic layer, a regular antiferromagnetic layer is formed. This regular antiferromagnetic layer can be formed from a FeMn film, a NiMn film, a PtMn film, a PdMn film, a PdPtMn film, a CrMn film, an IrMn film or the like. The regular antiferromagnetic layer can also be formed by using a conventional film forming process such as sputtering process.

A spin valve film usually has a cap layer as the outermost layer. The cap layer can be formed from a Ta film. The cap layer can also be formed by using a conventional film forming process such as a sputtering process.

The spin valve head can be manufactured in accordance with various conventional techniques. In the present invention, the above-described functional element layers can be formed with a desired pattern, accurately and superfinely, by incorporating the resist process using the negative resist composition of the present invention at any desired stage in manufacturing of the head. One example of the process for manufacturing the spin valve head will now be described.

First, Ta is deposited on an AlTiC substrate by the sputtering process to form a Ta base layer. The following layers are sequentially formed at the portion other than the magneto-sensitive portion as the signal detecting region on the Ta base layer through an electrode made of Au, using processes such as a lift-off process, an ion milling process and the like.

A base layer (film made of Ta/NiFe alloy, NiFe alloy: NiFe, NiFeCr, NiFeNb, NiFeMo, etc.)

A vertical bias magnetic field applying layer (film made of antiferromagnetic material such as PtMn, PdPtMn, NiMn, CrMn, CrPtMn, etc.)

A base layer (film made of NiFe alloy)

Then, the outermost surface of the Ta base layer and that of NiFe base layer are cleaned by using processes such as a lift-off process, an ion milling process and the like so that a contamination substance (so-called "contamination layer"), which is present on the surface, is removed.

After the completion of the cleaning step, the free magnetic layer, the non-magnetic layer, the pinned magnetic layer and the regular antiferromagnetic layer are sequentially formed, thereby to complete a spin valve film. Each layer is formed by the sputtering process, the deposition process, the CVD process or the like.

To obtain a spin valve film with a desired pattern, a resist film with a predetermined pattern is formed using the negative resist composition of the present invention after forming the spin valve film over the entire surface of a vertical bias magnetic field applying layer, and then the spin valve film at a region other than the desired region is removed by the ion milling process.

After formation of the spin valve film, a pair of electrodes are formed on the spin valve film at the portion other than the magneto-sensitive portion as the signal detecting region. The electrode can be preferably formed by lifting off an Au film. The electrode material is not limited to Au and other conventional electrode materials may be used, if necessary.

EXAMPLES

The following examples further illustrate the present invention in detail with respect to synthesis of the film-forming polymer, preparation of the resist composition, formation of the resist pattern, and manufacturing of the electron device. Furthermore, the following examples show only a few examples of the present invention, and it should be understood that the scope of the present invention is in no way limited by these examples. In the following general formulas, the abbreviation Me means a methyl group.

Example 1

Synthesis of 6-methoxy-2-tetrahydropyranylmethyl methacrylate/3-carboxyadamanthyl methacrylate copolymer (see the formula below)

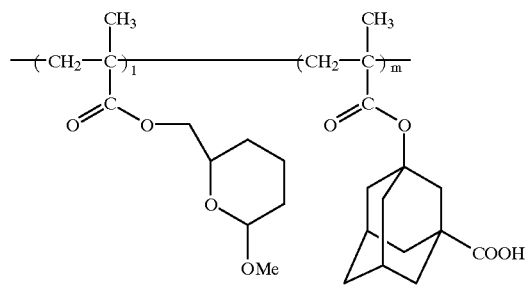

5 g (23.35 mmol) of 6-methoxy-2-tetrahydropyranylmethyl methacrylate, 6.15 g (23.35 mmol) of 3-carboxyadamanthyl methacrylate, a Teflon™-coated stirring bar, 15.5 ml of dioxane and 1.54 g (9.35 mmol) of azobisisobutyronitrile (AIBN) were charged in a 100 ml eggplant-type flask, and stirred in a nitrogen atmosphere at 70° C. for seven hours. After diluting the reaction solution with tetrahydrofuran (THF), the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 8.14 g (73%). The results of $^1$H-NMR proved that the ratio of pyranyl to adamanthyl in this copolymer is 52:48. The weight-average molecular weight was 11,400 and the dispersion degree was 1.43.

Example 2

Synthesis of 6-isopropoxy-2-tetrahydropyranylmethyl methacrylate/3-carboxyadamanthyl methacrylate copolymer (see the formula below)

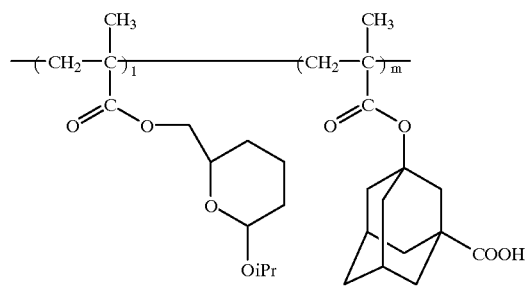

5.66 g (23.35 mmol) of 6-isopropoxy-2-tetrahydropyranylmethyl methacrylate, 6.15 g (23.35 mmol) of 3-carboxyadamanthyl methacrylate, a Teflon™-coated stirring bar, 15.5 ml of dioxane and 1.54 g (9.35 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 9.45 g (80%). The results of $^1$H-NMR proved that the ratio of pyranyl to adamanthyl in this copolymer is 53:47. The weight-average molecular weight was 10,800 and the dispersion degree was 1.48.

Example 3 synthesis of 4-(1-methoxy)ethoxycyclohexyl methacrylate/3-carboxyadamanthyl methacrylate copolymer (see the formula below)

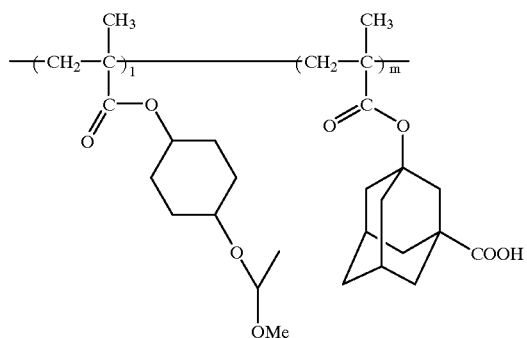

5.91 g (23.35 mmol) of 4-(1-methoxy)ethoxycyclohexyl methacrylate, 6.15 g (23.35 mmol) of 3-carboxyadamanthyl methacrylate, a Teflon™-coated stirring bar, 15.5 ml of dioxane and 1.54 g (9.35 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 8.92 g (70%). The results of $^1$H-NMR proved that the ratio of cyclohexyl to adamanthyl in this copolymer is 50:50. The weight-average molecular weight was 9,800 and the dispersion degree was 1.50.

Example 4 synthesis of 6-norbornyloxy-2-tetrahydropyranylmethyl acrylate/carboxytetracyclododecyl acrylate copolymer (see the formula below)

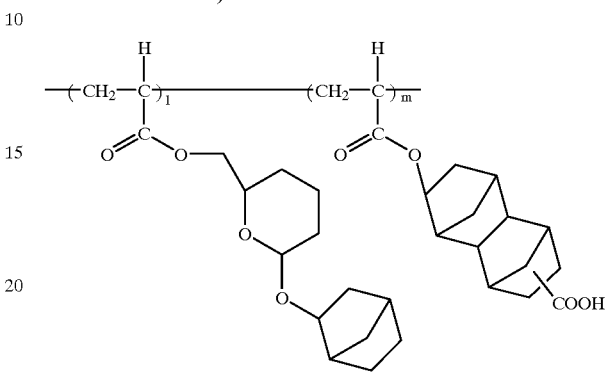

5.62 g (20 mmol) of 6-cyclohexyloxy-2-tetrahydropyranylmethyl methacrylate, 5.05 g (20 mmol) of carboxytetracyclododecyl acrylate, a Teflon™-coated stirring bar, 13.3 ml of dioxane and 985 mg (6 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 6.46 g (60.5%). The results of $^1$H-NMR proved that the ratio of pyranyl to dodecyl in this copolymer is 55:45. The weight-average molecular weight was 9,900 and the dispersion degree was 1.46.

Example 5

Synthesis of 6-methoxy-2-tetrapyranylmethyl methacrylate/3-methoxycarbonyladamanthyl methacrylate/3-carboxyadamanthyl methacrylate copolymer (see the formula below)

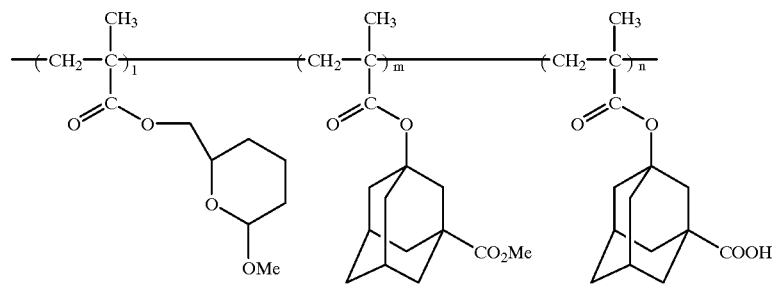

4.29 g (20 mmol) of 6-methoxy-2-tetrahydropyranylmethyl methacrylate, 1.67 g (6 mmol) of 3-methoxycarbonyladamanthyl methacrylate, 3.7 g (14 mmol) of 3-carboxyadamanthyl methacrylate, a Teflon™-coated stirring bar, 13.3 ml of dioxane and 985 mg (6 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 7.05 g (73%). The results of $^1$H-NMR proved that the ratio of pyranyl:methoxycarbonyladamanthyl:carboxyadamanthyl in this copolymer is 51:17:32. The weight-average molecular weight was 10,500 and the dispersion degree was 1.41.

Example 6

Synthesis of 6-methoxy-2-tetrapyranylmethyl methacrylate/5-norbornane-2,6-carbolactone methacrylate/3-carboxyadamanthyl methacrylate copolymer (see the Formula Below)

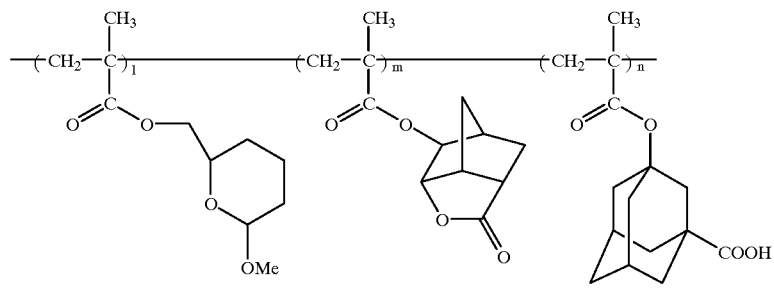

4.29 g (20 mmol) of 6-methoxy-2-tetrahydropyranylmethyl methacrylate, 1.33 g (6 mmol) of 5-norbornane-2,6-carbolactone methacrylate, 3.7 g (14 mmol) of 3-carboxyadamanthyl methacrylate, a Teflon™-coated stirring bar, 13.3 ml of dioxane and 985 mg (6 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 5.41 g (58%). The results of $^1$H-NMR proved that the ratio of pyranyl:norbornyl:adamanthyl in this copolymer is 51:15:34. The weight-average molecular weight was 10,700 and the dispersion degree was 1.39.

Example 7

Synthesis of 3-(6-methoxy-2-tetrahydropyranylmethyloxy)carbonyladamanthyl methacrylate/3-carboxyadamanthyl methacrylate copolymer (see the formula below)

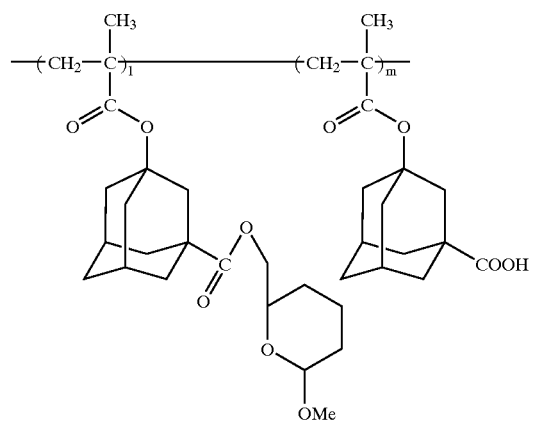

3.92 g (10 mmol) of 3-(6-methoxy-2-tetrahydropyranylmethyloxy)carbonyladamanthyl methacrylate, 2.64 g (10 mmol) of 3-carboxyadamanthyl methacrylate, a Teflon™-coated stirring bar, 13.3 ml of dioxane and 493 mg (3 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 3.41 g (52%). The results of $^1$H-NMR proved that the ratio of pyranyl to adamanthyl in this copolymer is 51:49. The weight-average molecular weight was 11,200 and the dispersion degree was 1.44.

Example 8

Synthesis of 6-methoxy-2-tetrapyranylmethyloxynorbornene/maleic anhydride/1,1,1-trifluoro-2-trifluoromethyl-2-hydroxypropylnorbornene copolymer (see the formula below)

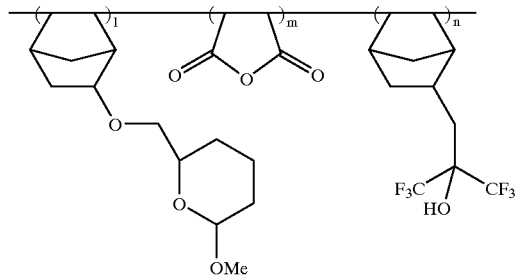

2.38 g (10 mmol) of 6-methoxy-2-tetrahydropyranylmethyloxynorbornene, 0.98 g (10 mmol) of maleic anhydride, 2.62 g (10 mmol) of 1,1,1-trifluoro-2-trifluoromethyl-2-hydroxypropylnorbornene, a Teflon™-coated stirring bar, 20 ml of dioxane and 493 mg (3 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 4.90 g (82%). The results of $^1$H-NMR proved that the ratio in this copolymer is 1:1:1. The weight-average molecular weight was 9,200 and the dispersion degree was 1.36.

Example 9

Synthesis of 6-methoxy-2-tetrapyranylmethyl methacrylate/maleic anhydride/norbornenecarboxylic acid copolymer (see the formula below)

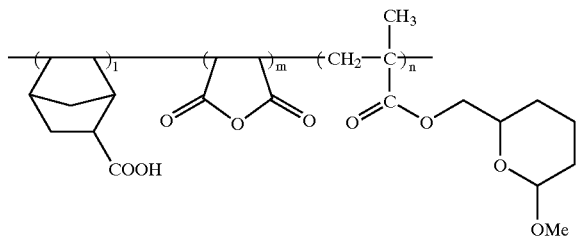

2.14 g (10 mmol) of 6-methoxy-2-tetrahydropyranylmethyl methacrylate, 0.98 g (10 mmol) of maleic anhydride, 1.38 g (10 mmol) of norbornenecarboxylic acid, a Teflon™-coated stirring bar, 20 ml of dioxane and 493 mg (3 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 3.83 g (85%). The results of $^1$H-NMR proved that the ratio in this copolymer is 1:1:1. The weight-average molecular weight was 9,000 and the dispersion degree was 1.34.

Example 10

Synthesis of 6-methoxy-2-tetrapyranylmethyl acrylate/hydroxystyrene copolymer (see the formula below)

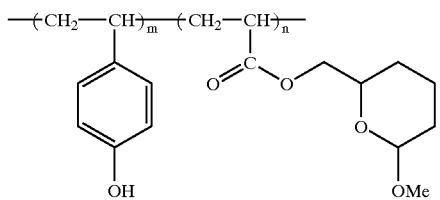

483 mg (2.41 mmol) of 6-methoxy-2-tetrahydropyranylmethyl acrylate, 4.66 g (27.75 mmol) of acetoxystyrene, a Teflon™-coated stirring bar, 10 ml of dioxane and 743 mg (4.5 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of methanol containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated to obtain a white resin powder. Furthermore, the resin powder was treated with a basic methanol solution to obtain a desired resin. Yield was 3.1 g. The results of $^1$H-NMR proved that the ratio in this copolymer is 92:8. The weight-average molecular weight was 7,800 and the dispersion degree was 1.35.

Example 11

The resin synthesized in Example 1 was dissolved in ethyl lactate (EL) to prepare a 15% by weight solution. Furthermore, this solution also contained 10% by weight of γ-butyrolactone as an auxiliary solvent. 2% by weight of triphenylsulfonium trifluoromethane sulfonate was added to the resulting solution and completely dissolved. After filtering the resulting resist solution with a 0.2 μm Teflon™ membrane filter, it was spin coated on a silicon substrate treated with HMDS and pre-baked at 110° C. for 60 seconds to obtain a resist film having a thickness of 0.4 μm. After exposing this resist film with a KrF excimer laser stepper (NA=0.45), it was baked at 120° C. for 60 seconds, developed with an aqueous 2.38% solution of tetramethylammonium hydroxide (TMAH), and rinsed with deionized water. The film resolved a 0.25 μm line-and-space (L/S) pattern at an exposure dose of 16.0 mJ/cm².

Example 12

Using the resist solution prepared in Example 11, a resist film having a thickness of 0.4 μm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 μm L/S pattern at an exposure dose of 9.0 mJ/cm².

Example 13

In the same manner as in Example 11, a resist solution was prepared by using the resist solution prepared in Example 2, and then a resist film having a thickness of 0.4 μm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 μm L/S pattern at an exposure dose of 12 mJ/cm².

Example 14

In the same manner as in Example 11, a resist solution was prepared by using the resist solution prepared in Example 3, and then a resist film having a thickness of 0.4 μm was formed. After exposing this resist film with an ArF excimer laser stepper (NA=0.60), it was baked at 130° C. for 60 seconds, developed with an aqueous 2.38% solution of tetramethylammonium hydroxide (TMAH), and rinsed with deionized water. The film resolved a 0.15 μm L/S pattern at an exposure dose of 11 mJ/cm².

Example 15

In the same manner as in Example 11, a resist solution was prepared by using the resist solution prepared in Example 4, and then a resist film having a thickness of 0.4 µm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 µm L/S pattern at an exposure dose of 14 mJ/cm².

Example 16

In the same manner as in Example 11, a resist solution was prepared by using the resist solution prepared in Example 5, and then a resist film having a thickness of 0.4 µm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 µm L/S pattern at an exposure dose of 8 mJ/cm².

Example 17

In the same manner as in Example 11, a resist solution was prepared by using the resist solution prepared in Example 6, and then a resist film having a thickness of 0.4 µm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 µm L/S pattern at an exposure dose of 9 mJ/cm².

Example 18

In the same manner as in Example 11, a resist solution was prepared by using the resist solution prepared in Example 7, and then a resist film having a thickness of 0.4 µm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 µm L/S pattern at an exposure dose of 8 mJ/cm².

Example 19

In the same manner as in Example 11, a resist solution was prepared by using the resist solution prepared in Example 8, and then a resist film having a thickness of 0.4 µm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 µm L/S pattern at an exposure dose of 18 mJ/cm².

Example 20

In the same manner as in Example 11, a resist solution was prepared by using the resist solution prepared in Example 9, and then a resist film having a thickness of 0.4 µm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 µm L/S pattern at an exposure dose of 16 mJ/cm².

Example 21

In the same manner as in Example 11, a resist solution was prepared by using the resist solution prepared in Example 10, and then a resist film having a thickness of 0.4 µm was formed. After exposing this resist film with a KrF excimer laser stepper (NA=0.68), it was baked at 110° C. for 60 seconds, developed with an aqueous 2.38% solution of tetramethylammonium hydroxide (TMAH), and rinsed with deionized water. The film resolved a 0.18 µm L/S pattern at an exposure dose of 12 mJ/cm².

Example 22

10% by weight of a 6-methoxy-2-tetrahydropyranylmethyl methacrylate homopolymer was added to polyhydroxystyrene and the mixture was dissolved in EL to prepare a resist solution. After a resist film having a thickness of 0.4 µm was formed and exposed with a KrF excimer laser stepper (NA=0.68), it was baked at 110° C. for 60 seconds, developed with an aqueous 2.38% solution of tetramethylammonium hydroxide (TMAH), and rinsed with deionized water. The film resolved a 0.18 µm L/S pattern at an exposure dose of 15 mJ/cm².

Example 23

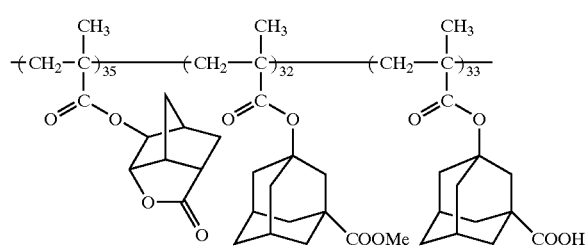

12% by weight of a 4-(1-methoxy)ethoxycyclohexyl methacrylate homopolymer (weight-average molecular weight: 5,600) was added to a resin (weight-average molecular weight: 9,500) represented by the above-mentioned structural formula and the mixture was dissolved in EL to prepare a resist solution. After a resist film having a thickness of 0.4 µm was formed and exposed with an ArF excimer laser stepper (NA=0.60), it was baked at 110° C. for 60 seconds, developed with an aqueous 2.38% solution of tetramethylammonium hydroxide (TMAH), and rinsed with deionized water. The film resolved a 0.16 µm L/S pattern at an exposure dose of 15 mJ/cm².

Example 24

Synthesis of 6-methoxy-2-tetrahydropyranylmethyl methacrylate/3,4-carbolactoneadamanthyl methacrylate/3-carboxyadamanthyl methacrylate copolymer (see the formula below)

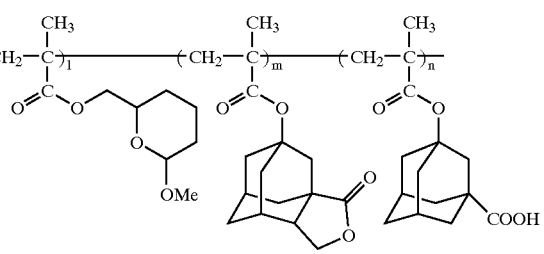

4.29 g (20 mmol) of 6-methoxy-2-tetrahydropyranylmethyl methacrylate, 1.66 g (6 mmol) of 3,4-carbolactoneadamanthyl methacrylate, 3.7 g (14 mmol) of 3-carboxyadamanthyl methacrylate, a Teflon™-coated stirring bar, 13.3 ml of dioxane and 985 mg (6 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone.

The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 5.8 g (60%). The results of ¹H-NMR proved that the ratio of pyranyl:lactone:adamanthyl in this copolymer is 51:16:33. The weight-average molecular weight was 10,100 and the dispersion degree was 1.41.

Example 25

Synthesis of 3-(1-methoxy)ethoxyadamanthyl methacrylate/3,4-carbolactoneadamanthyl methacrylate/3-carboxyadamanthyl methacrylate copolymer (see the formula below)

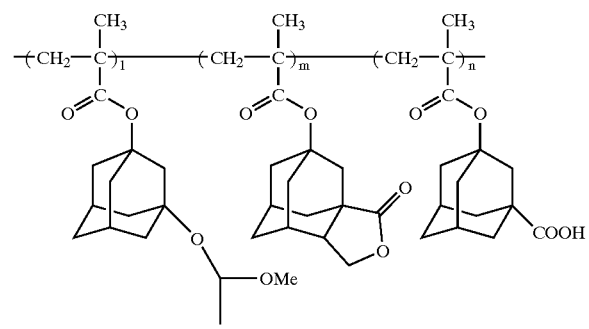

5.89 g (20 mmol) of 3-(1-methoxy)ethoxyadamanthyl methacrylate, 1.66 g (6 mmol) of 3,4-carbolactoneadamanthyl methacrylate, 3.7 g (14 mmol) of 3-carboxyadamanthyl methacrylate, a Teflon™-coated stirring bar, 13.3 ml of dioxane and 985 mg (6 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 6.1 g (54.2%). The results of ¹H-NMR proved that the ratio of pyranyl:lactone:adamanthyl in this copolymer is 50:16:34. The weight-average molecular weight was 9,100 and the dispersion degree was 1.37.

Example 26

Synthesis of 3-(1-methoxy)ethoxyadamanthyl methacrylate/N-hydroxymethacrylamide copolymer (see the formula below)

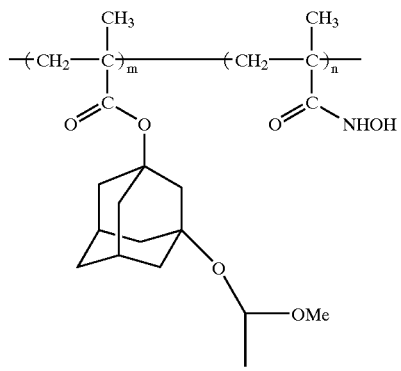

4.82 g (16.36 mmol) of 3-(1-methoxy)ethoxyadamanthyl methacrylate, 2.02 g (20 mmol) of N-hydroxymethacrylamide, a Teflon™-coated stirring bar, 18 ml of dioxane and 895 mg (5.45 mmol) of azobisisobutyronitrile (AIBN) were charged in a 100 ml eggplant-type flask, and stirred in a nitrogen atmosphere at 70° C. for seven hours. After diluting the reaction solution with THF, the diluted solution was added dropwise in 1 liter of diethyl ether containing a small amount of hydroquinone. The resulting precipitate was collected by filtering with a glass filter and dried at 45° C. under 0.1 mmHg for six hours. The resulting white powder was dissolved again in THF and the above-mentioned precipitation and drying operations were repeated twice to obtain a white resin powder. Yield was 3.97 g (58%). The results of ¹H-NMR proved that the ratio of adamanthyl:amide in this copolymer is 40:60. The weight-average molecular weight was 8,900 and the dispersion degree was 1.52.

Example 27

In the same manner as in Example 11, a resist solution was prepared by using the resin prepared in Example 24, and then a resist film having a thickness of 0.4 μm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 μm L/S pattern at an exposure dose of 11 mJ/cm².

Example 28

In the same manner as in Example 11, a resist solution was prepared by using the resin prepared in Example 25, and then a resist film having a thickness of 0.4 μm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 μm L/S pattern at an exposure dose of 10 mJ/cm².

Example 29

In the same manner as in Example 11, a resist solution was prepared by using the resin prepared in Example 26, and then a resist film having a thickness of 0.4 μm was formed. After exposing this resist film with an ArF excimer laser stepper (NA=0.60), it was baked at 120° C. for 60 seconds, developed with an aqueous 2.38% solution of tetramethylammonium hydroxide (TMAH), and rinsed with deionized water. The film resolved a 0.15 μm L/S pattern at an exposure dose of 20 mJ/cm².

Example 30

Each of resist solutions prepared in Examples 5, 7, 8, 10 and 28 was coated on a silicon substrate to form a resist film having a thickness of 1 μm. In addition, for comparison, resist films having the same thickness were formed by using a commercially available Novolak resist PFI-16, manufactured by Sumitomo Chemical Industries Co., Ltd., and a general resist PMMA (polymethyl methacrylate). Using a parallel plate reactive ion etcher (RIE), each resist film was etched for five minutes under the conditions of Pμ of 200 W, a pressure of 0.02 Torr, and a CF₄ gas of 100 sccm, and then a reduction in weight of the film was compared. The measurement results shown in Table 1 were obtained.

TABLE 1

| Resist | Etching rate (Å/second) | Rate ratio |
|---|---|---|
| PFI-16 | 510 | 1.00 |
| PMMA | 760 | 1.49 |
| Example 5 | 617 | 1.21 |
| Example 7 | 505 | 0.99 |
| Example 8 | 612 | 1.20 |
| Example 10 | 658 | 1.29 |
| Example 28 | 500 | 0.98 |

As can be understood from the above results, the etching resistance of the resist composition according to the present invention is comparable to that of Novolak resist and, particularly, resists of Examples 7 and 28 have the composition that can cope with ArF exposure and exhibit the etching resistance which is superior to that of the novolak. It could be confirmed from this test that all resists (examples of the present invention) are far superior to PMMA (prior art example).

Example 31

Synthesis of 6-methoxy-2-tetrahydropyranylmethyl group-containing tetrafunctional siloxane polymer (see the formula below)

4.6 g (15 mmol) of 1,3-bis(carboxypropyl) tetramethyldisiloxane, a Teflon™-coated stirring bar, 23 ml of pure water and 13 ml of acetic acid were charged in a 200 ml four-necked flask, and stirred in a nitrogen atmosphere at 60° C. 8.32 g (40 mmol) of tetraethoxysilane was added dropwise in the mixture and stirring was continued for one hour. Then, 4.16 g (20 mmol) of tetraethoxysilane was added dropwise over 30 minutes and the resulting mixture was stirred for three hours. After washing the reaction solution with water until it is neutralized, the organic layer was transferred to a 200 ml four-necked flask and dehydrated by azeotropy. After the reaction solution was concentrated to 30 ml, the resulting concentrate, 6 ml of pyridine, a Teflon™-coated stirring bar and 10 ml of tetrahydrofuran (THF) were charged in a 200 ml four-necked flask, and stirred in a nitrogen atmosphere at 60° C.

Furthermore, 3.08 g (10 mmol) of a compound of the following formula:

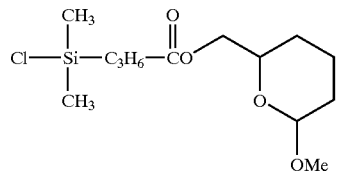

and 0.54 g (5 mmol) of trimethylchlorosilane were added dropwise in the stirred mixture, and stirred for two hours. After the mixture was naturally filtered and the precipitate was removed, the resulting reaction solution was washed with water until it is neutralized. The organic layer was transferred to a 200 ml four-necked flask and dehydrated by azeotropy, and then the resulting reaction solution was added dropwise in 1000 ml of hexane. The precipitated reaction product was dissolved in dioxane and then freeze-dried to obtain a white resin powder. Yield was 3.1 g. The results of $^1$H-NMR and $^{29}$Si-NMR proved that the ratio in this copolymer is 32:30:25:13. The weight-average molecular weight was 6,000 and the dispersion degree was 1.40.

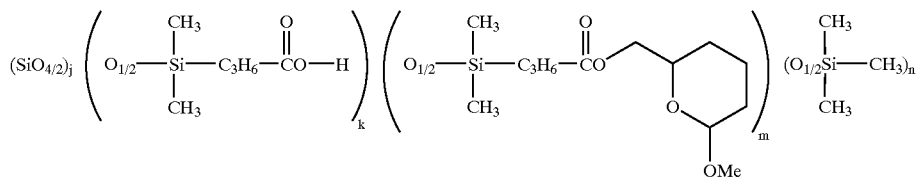

Example 32

Synthesis of 6-methoxy-2-tetrahydropyranylmethyl group-containing trifunctional siloxane polymer (see the formula below)

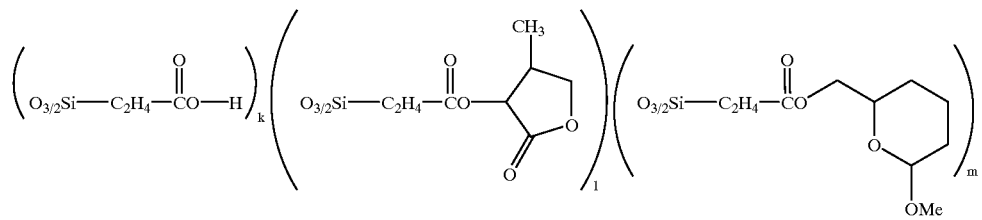

After 25 ml of pure water and a Teflon™-coated stirring bar were charged in a 200 ml four-necked flask, 9.4 g (50 mmol) of 2-cyanoethyltrichlorosilane dissolved in 10 ml of toluene was added dropwise while stirring in a nitrogen atmosphere at room temperature. The mixture in the flask was stirred under reflux conditions for five hours, and then the reaction solution was washed with water until it was neutralized. The organic layer was transferred to a 200 ml four-necked flask and dehydrated by azeotropy. After the reaction solution was concentrated, the condensate was added dropwise in 1000 ml of water. The resulting precipitate was dried to obtain a slime-like resin.

Then, the resulting slime-like resin, a Teflon™-coated stirring bar, 10.1 ml of triethylamine, 10 ml of dimethylformamide and 10 ml of tetrahydrofuran (THF) were charged in a 200 ml four-necked flask, and stirred in a nitrogen atmosphere at 60° C.

Furthermore, 5.37 g (30 mmol) of a compound of the following formula:

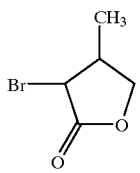

and 12.5 g (60 mmol) of a compound of the following formula:

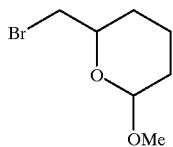

were simultaneously added dropwise in the stirred mixture, and stirred for three hours. After the resulting reaction solution was washed with water until it is neutralized, the organic layer was transferred to a 200 ml four-necked flask and dehydrated by azeotropy. The reaction solution was concentrated and the concentrate was added dropwise in 1000 ml of water. The resulting precipitate was dried to obtain a white resin powder. Yield was 4.5 g. The results of $^1$H-NMR and $^{29}$Si-NMR proved that the ratio in this copolymer is 48:15:37. The weight-average molecular weight was 5,300 and the dispersion degree was 1.51.

Example 33

The resin synthesized in Example 31 was dissolved in methyl isobutyl ketone to prepare a 4% by weight solution. 2% by weight of triphenylsulfonium trifluoromethane sulfonate was added to the resulting solution and completely dissolved. After filtering the resulting resist solution with a 0.2 μm Teflon™ membrane filter, it was spin coated on a silicon substrate treated with HMDS and pre-baked at 110° C. for 60 seconds to obtain a resist film having a thickness of 0.1 μm. After exposing this resist film with an ArF excimer laser stepper (NA=0.60), it was baked at 110° C. for 60 seconds, developed with an aqueous 2.38% solution of tetramethylammonium hydroxide (TMAH), and rinsed with deionized water. The film resolved a 0.16 μm line-and-space (L/S) pattern at an exposure dose of 16.0 mJ/cm².

Example 34

In the same manner as in Example 33, a resist solution was prepared by using the resin prepared in Example 32, and then a resist film having a thickness of 0.1 μm was formed. After exposing this resist film with an ArF excimer laser stepper (NA=0.60), it was baked at 110° C. for 60 seconds, developed with an aqueous 2.38% solution of tetramethylammonium hydroxide (TMAH), and rinsed with deionized water. The film resolved a 0.15 μm L/S pattern at an exposure dose of 12 mJ/cm².

Example 35

Each of resist solutions prepared in Examples 33 and 34 was coated on a silicon substrate to form a resist film having a thickness of 1 μm. In addition, for comparison, resist films having the same thickness were formed by using a commercially available Novolak resist PFI-16, manufactured by Sumitomo Chemical Industries Co., Ltd., and a general resist PMMA (polymethyl methacrylate) used generally as a lower layer resist for flattening in the two-layer resist process. Using a parallel plate reactive ion etcher (RIE), each resist film was etched for five minutes under the conditions of Pμ of 200 W, a pressure of 0.02 Torr, and an $O_2$ gas of 20 sccm, and then a reduction in weight of the film was compared. The measurement results shown in Table 2 were obtained.

TABLE 2

| Resist | Etching rate (Å/second) | Rate ratio |
|---|---|---|
| PFI-16 | 510 | 1.00 |
| PMMA | 760 | 1.49 |
| Example 33 | 12 | 0.024 |
| Example 34 | 31 | 0.061 |

As can be confirmed from the above results shown in Table 2, the etching resistance of the resist composition according to the present invention is high, for example, an etching rate ratio of Novolak resist as a lower layer is 0.024 in the case of a tetrafunctional siloxane polymer, while the etching rate ratio is 0.061 in the case of a trifunctional siloxane polymer, and thus each resist can be satisfactorily transferred onto the lower layer resist.

Example 36

Manufacturing of MOS Transistor

As shown in the step of FIG. 1A, a gate oxide film 2 was formed on the surface of a silicon substrate 1 and a Poly-Si (polysilicon) film 3 was further formed on the gate oxide film by the CVD process. After forming the Poly-Si film 3, the resistance was lowered by injecting n-type impurities such as phosphorous. A WSi film 4 was then formed by the sputtering process. This process may be replaced by the CVD process.

Figure 1B:
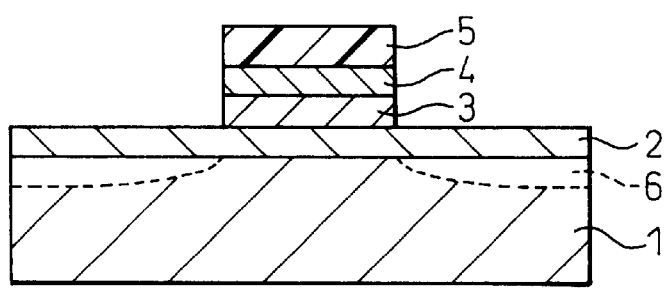

Next, as shown in the step of FIG. 1B, a negative resist composition of the present invention was applied over the entire surface of the Wsi film 4 formed in the previous step in order to perform patterning of the Poly-Si film 3 and the Wsi film 4. A resist film 5 was pre-baked, exposed to light with an ArF excimer exposure device and then post-exposure baked (PEB). A resist pattern having a width of 0.25 μm was obtained by developing with an alkali. Using this resist pattern as a mask, anisotropic etching was then carried out on the WSi film 4 and the Poly-Si film 3 in order. As a result, a gate electrode comprising the Poly-Si film 3 and the WSi film 4 was obtained. After forming the gate electrode, ions were injected by ion implantation to form an N⁻ diffusion layer 6 having an LDD structure. After the pattern shown in the step of FIG. 1B was obtained, the resist film 5 was removed by a remover.

Figure 1C:
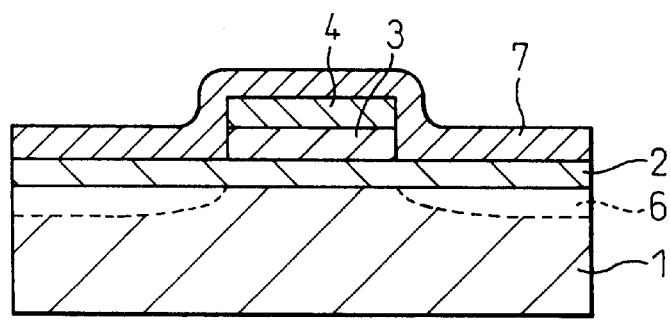

After forming the gate electrode, as shown in the step of FIG. 1C, an oxide film 7 was formed over the entire surface by the CVD process.

Figure 1D:
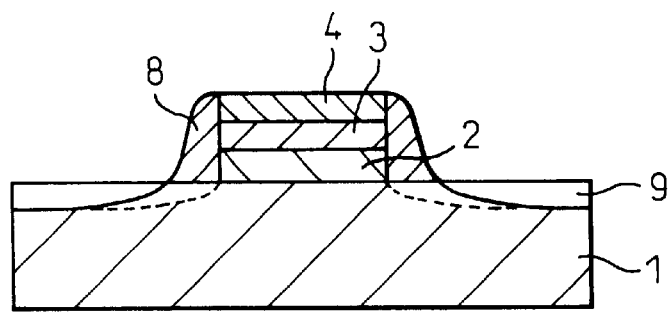

As shown in the step of FIG. 1D, anisotropic etching was carried out on the oxide film 7 to form a sidewall 8 in the side wall portion of the gate electrode comprising the WSi film 4 and the Poly-Si film 3. Then, ion implantation was carried out using the WSi film 4 and the sidewall 8 as masks to form an N⁺ diffusion layer 9.

Figure 1E:
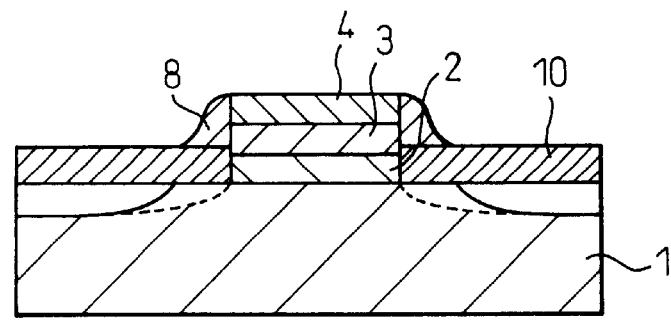

To activate the N⁺ diffusion layer 9, the silicon substrate was heat-treated in a nitrogen atmosphere, followed by further heating in an oxygen atmosphere to form a thermal oxide film covering the gate oxide film 10, as shown in the step of FIG. 1E.

Figure 1F:
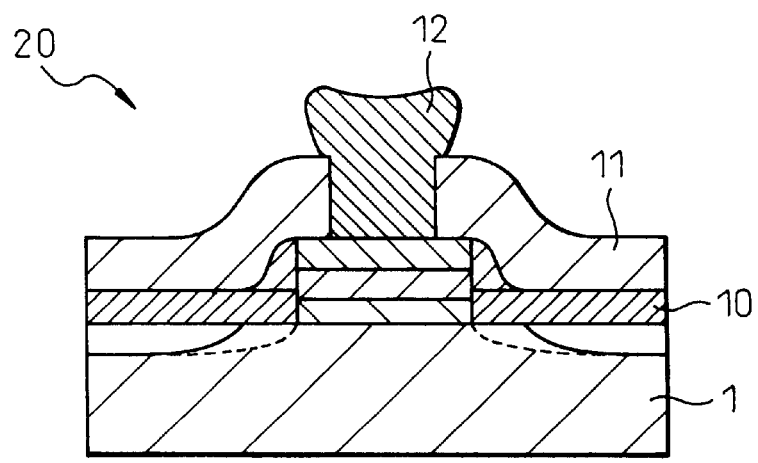

As shown in the step of FIG. 1F, an interlayer insulating film 11 was formed by the CVD process and patterning of the interlayer insulating film 11 was carried out by using the negative resist composition of the present invention. After the resist composition of the present invention was applied over the entire surface of the interlayer insulating film 11, the resist film (not shown) was pre-baked, exposed to light with an ArF excimer exposure device and then post-exposure baked (PEB). A hole pattern having a width of 0.20 μm was obtained by developing with an alkali. Moreover, a contact hole was formed by conducting anisotropic etching on the underlying interlayer insulating film 11 using the resist pattern as a mask. Finally, aluminum (Al) wiring was embedded in the contact hole to complete an N channel, hyperfine MOS transistor 20.

Example 37
Manufacturing of Thin-film Magnetic Head

Figure 2A:
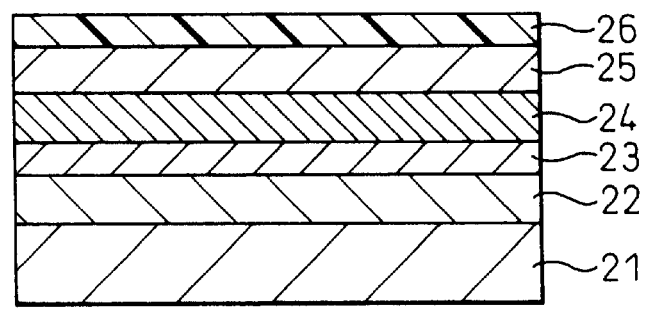
FIGS. 2A, 2B, 2C, 2D, 2E, 2F, 2G, 2H and 2I are cross-sectional views which show, in order, the manufacturing processes of the thin-film magnetic head according to the present invention.

As shown in the step of FIG. 2A, a shield film 22 made of FeN and a gap insulating film 23 made of a silicon oxide film were sequentially laminated on an AlTiC substrate 21, and then a magnetic resistance effect film 24 having a thickness of 400 nm was formed thereon by the sputtering process using FeNi. A conventional PMGI resist, manufactured by Microlithography Chemical Co., USA, was applied on the magnetic resistance effect film 24 to form a lower layer resist film 25, and then the negative resist composition of the present invention was further applied thereon. As a result, an upper layer resist film 26 was formed.

Figure 2B:
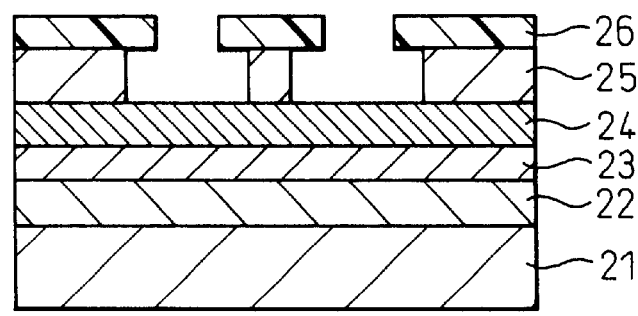

After forming the two-layer structure resist film comprising an upper layer and a lower layer, the upper layer resist film 26 was pre-baked, exposed to light with a KrF excimer exposure device and then post-exposure baked (PEB). A resist pattern having a width of 0.25 μm was obtained by developing with an alkali. Simultaneously with the alkali development, the underlying lower layer resist film 25 was isotropically developed to complete an undercut shape, as shown in the step of FIG. 2B.

Figure 2C:
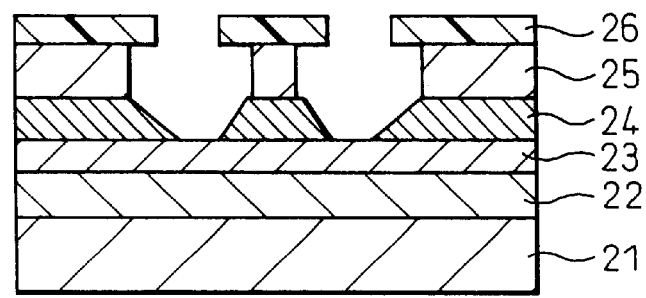

As shown in the step of FIG. 2C, the underlying magnetic resistance effect film 24 was taperedly etched by ion milling using the resulting resist pattern as a mask.

Figure 2D:
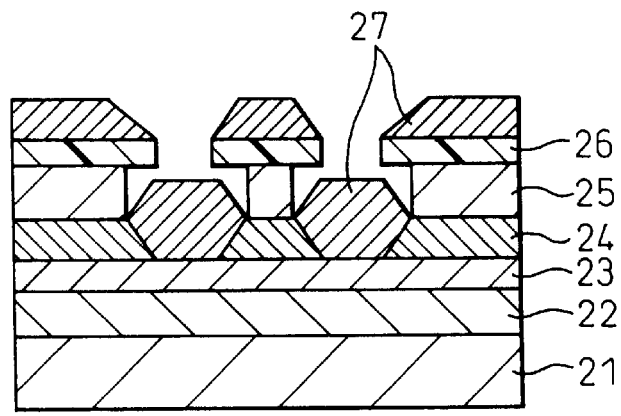

As shown in the step of FIG. 2D, a TiW film 27 was formed over the entire surface of the face to be treated by the sputtering process. The thickness of the TiW film 27 was 800 nm.

Figure 2E:
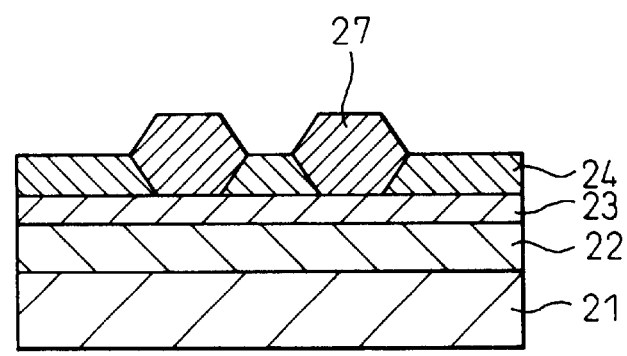

After the completion of formation of the TiW film 27, the lower layer resist film 25 as well as the upper layer resist film 26 and the TiW film 27 formed thereon were removed by the lift-off process. As shown in the step of FIG. 2E, it reached the state where the TiW film 27 is exposed.

Figure 2F:
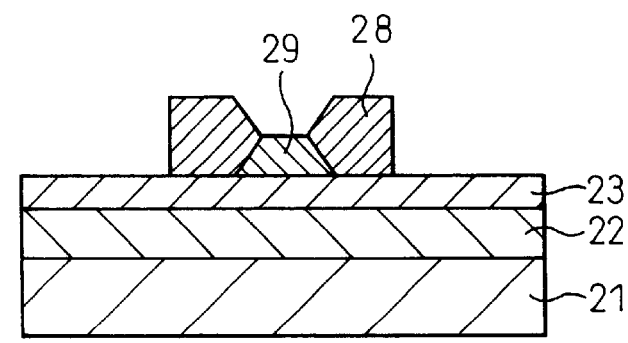

Although not shown in the drawing, patterning of the magnetic resistance effect film 24 and the TiW film 27 was carried out by using the negative resist composition of the present invention in the same procedure as described above. As shown in the step of FIG. 2F, an electrode 28 and a MR element 29 were completed.

Figure 2G:
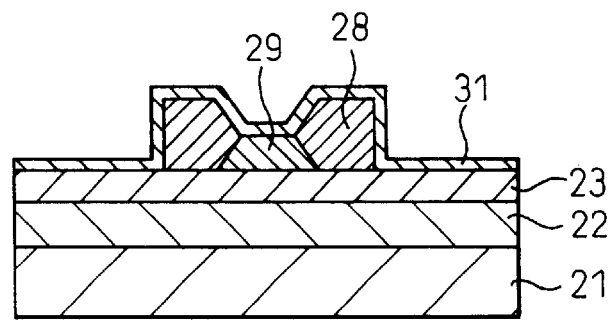

Subsequently, as shown in the step of FIG. 2G, a gap insulating film 31 of a SiO$_2$ layer having a thickness of 50 nm was formed over the entire surface of the face to be treated.

Figure 2H:
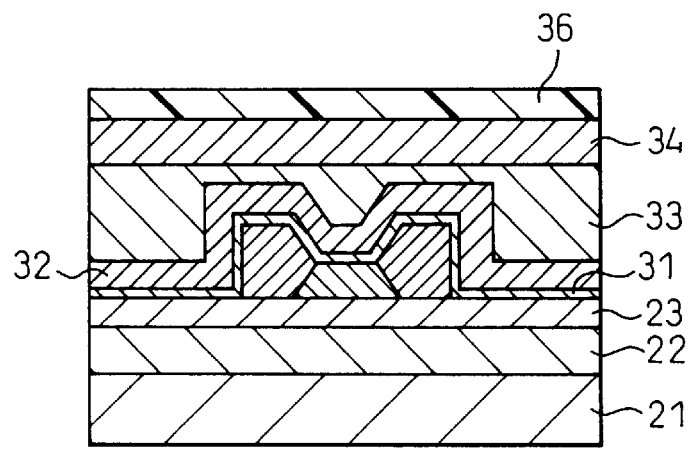

As shown in the step of FIG. 2H, after forming the gap insulating film 31, a shield film 32 of a FeNi film having a thickness of 3.5 μm and a gap layer 33 of an Al$_2$O$_3$ film having a thickness of 0.5 μm were formed in order on the entire surface of the gap insulating film 31, and then a FeNi film 34 having a thickness of 3 μm was further formed thereon. To form a writing magnetic pole by patterning of the FeNi film 34, the negative resist composition of the present invention was applied over the entire surface of the FeNi film 34 to form a resist film 36.

Figure 2I:
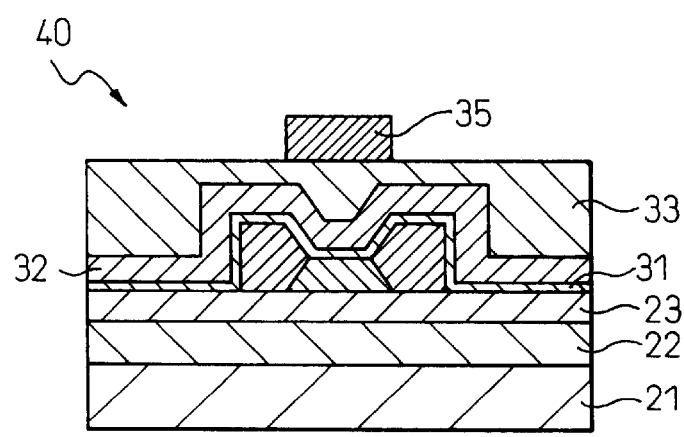

Finally, the resist film thus formed on the FeNi film 34 was pre-baked, exposed to light with a KrF excimer exposure device and then post-exposure baked (PEB). A hyperfine resist pattern with an opened writing magnetic pole portion was obtained by developing with an alkali. Using this resist pattern as a mask, the FeNi film was etched by the isotropic etching process. As shown in the step of FIG. 2I, a thin-film magnetic head 40 with a writing magnetic pole 35 was completed.

As can be understood from the above description, in the case of a resist material having, as a principal component, a conventional resin such as novolak having a phenol ring, there is a limitation in light transmission properties, that is, transmissible light is limited to light having a wavelength of 210 nm or longer such as KrF (krypton fluoride) excimer laser light (248 nm). Accordingly, the resist material of the present invention can be useful in view of its good light transmission properties when exposed to light having a wavelength of 210 nm or longer.

The reason why the negative resist has attracted special interest lately, and its development is now required, is as follows. That is, in order to make plans for prolonging the life of the light exposure process, and avoiding an exposure process with poor through-put like electron beam exposure process, the wavelength can be shorten and, at the same time, a phase-shift mask as one of so-called "superresolution technologies" is used in combination, thereby affording easy handling. Thus, it becomes easier to perform pattern designing of the phase-shift mask itself. To put it the other way around, when using in combination with the phase shift mask, accompanying effects can be obtained such that a mask pattern can be easily designed and it is suited for formation of a hyperfine pattern by means of light exposure.

As is appreciated from the above detailed descriptions, when using the resist composition of the present invention, it becomes possible to form a hyperfine pattern which has a sensitivity suited for practical use and is free from swelling.

In case an alkali-soluble polymer of this resist composition is formed in the form of a tercopolymer and, furthermore, a first monomer unit has a strong alkali-soluble group and a second monomer unit has a weak alkali-soluble group, the alkali solubility is easily controlled. When the resist composition contains a vinyl ether structure protected with an acetal, in addition to the alkali-soluble polymer, the intermolecular or intramolecular etherification reaction can be employed and, therefore, a pattern can be formed by a change in polarity, along with a conventional crosslinking type, and high contrast and high definition can be easily obtained.

According to the present invention, it becomes possible to manufacture a functional element layer contained in a device with accuracy and good yield, when using the negative resist composition of the present invention, and thus making it possible to advantageously manufacture an electronic device such as a semiconductor device, a magnetic recording head or the like.

When using the negative resist composition of the present invention in combination with a phase-shift mask or a Levenson-type mask, it becomes possible to advantageously form a hyperfine pattern.

What is claimed is:

1. A negative resist composition comprising at least a constituent component which has a vinyl ether structure protected with an acetal in a molecule thereof, the acetal-protected vinyl ether structure having a partial structure represented by any one of the following formulas (I) to (III):

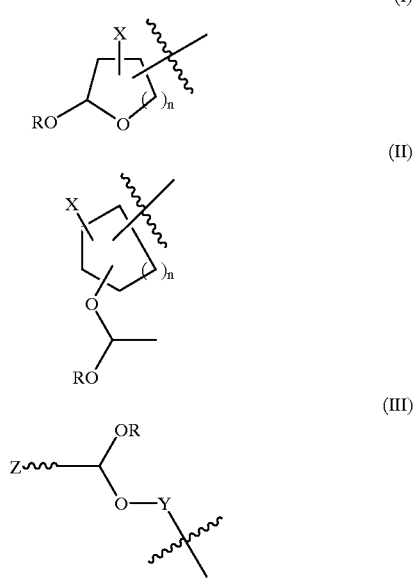

wherein X represents a hydrogen atom or an arbitrary substituent, and X itself may have an additional vinyl ether structure protected with an acetal and is capable of bonding the vinyl ether structure at an arbitrary position other than 1- and 2-positions, Y and R each represents an arbitrary hydrocarbon group and may be straight-chain or branched, Z represents a hydrogen atom or an arbitrary substituent, and Z itself may have an additional vinyl ether structure protected with an acetal, and n represents an integer of 1 to 6.

2. The negative resist composition according to claim 1, wherein the constituent component having an acetal-protected vinyl ether structure is a film-forming polymer, which is soluble in an aqueous basic solution and has an alkali-soluble group, and the acetal-protected vinyl ether structure is contained in the side chain of the film-forming polymer.

3. The negative resist composition according to claim 2, wherein the film-forming polymer is an alkali-soluble silicon-containing polymer.

4. The negative resist composition according to claim 2 or 3, which comprises the film-forming polymer and a photo acid generator capable of generating an acid that can react with the alkali-soluble group after the acetal-protected vinyl ether structure produces a deacetalization reaction when decomposed as a result of absorption of imaging radiation, wherein the negative resist composition itself is soluble in an aqueous basic solution and the exposed portion becomes insoluble in an alkali after exposure.

5. The negative resist composition according to claim 1, wherein the constituent component having an acetal-protected vinyl ether structure is a compound containing the acetal-protected vinyl ether structure in its molecule.

6. The negative resist composition according to claim 5, which comprises a film-forming polymer having an alkali-soluble group and a combination of the compound containing an acetal-protected vinyl ether structure and a photo acid generator capable of generating an acid that can react with the alkali-soluble group after the acetal-protected vinyl ether structure produces a deacetalization reaction when decomposed as a result of absorption of imaging radiation, wherein the negative resist composition itself is soluble in an aqueous basic solution and the exposed portion becomes insoluble in an alkali after exposure.

7. The negative resist composition according to any one of claims 2, 3 and 6, wherein the alkali-soluble group is selected from the group consisting of a phenol group, a carboxyl group, an N-hydroxyamide group, an oxime group, an imide group, a 1,1,1,3,3,3,-hexafluorocarbinol group and a sulfonic acid group.

8. The negative resist composition according to any one of claims 2, 3, 6, wherein the film-forming polymer is formed by polymerizing a monomer selected from the group consisting of an acrylic acid, a methacrylic acid, an itaconic acid, a vinylbenzoic acid, norbornene, vinylphenol, styrene and derivatives thereof.

9. The negative resist composition according to any one of claims 2, 3, and 6, wherein the film-forming polymer contains a weak alkali-soluble group selected from the group consisting of a lactone ring, an imide ring and an acid anhydride.

10. The negative resist composition according to any one of claims 2, 3, and 6, wherein the film-forming polymer contains a polycyclic alicyclic hydrocarbon moiety.

11. The negative resist composition according to claim 10, wherein the polycyclic alicyclic hydrocarbon moiety contains a member selected from the group consisting of an adamanthyl group, a norbornyl group and a bicyclo[2.2.2] octyl group.

12. The negative resist composition according to claim 11, which has at least an alkoxycarbonyl group and/or a ketone group in the polycyclic alicyclic hydrocarbon moiety.

13. The negative resist composition according to claim 1, which further contains an alicyclic structure and/or a polycyclic alicyclic structure, in addition to the partial structure represented by any one of the above formulas (I) to (III).

14. The negative resist composition according to claim 1 wherein an absorbance at a wavelength of an exposure light source is 1.75 $\mu m^{-1}$ or less.

15. The negative resist composition according to claim 1 which contains solvents selected from the group consisting of ethyl lactate, methyl amyl ketone, methyl-3-methoxypropionate, ethyl-3-ethoxypropionate, propylene glycol methyl ether acetate, methyl isobutyl ketone and n-butyl ether alone or in combination.

16. The negative resist composition according to claim 15, which further contains a solvent selected from the group consisting of butyl acetate, γ-butyrolactone and propylene glycol methyl ether as an additive solvent.

17. A process for forming a resist pattern which comprises the following steps of:

applying a negative resist composition comprising at least a constituent component which has a vinyl ether structure protected with an acetal in a molecule thereof, the acetal-protected vinyl ether structure having a partial structure represented by any one of the following formulas (I) to (III):

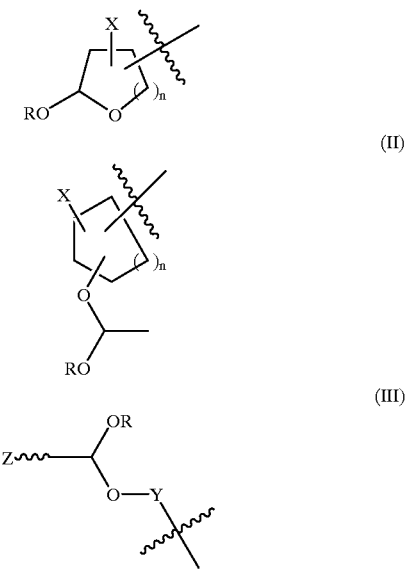

(I)
(II)
(III)

wherein X represents a hydrogen atom or an arbitrary substituent, and X itself may have an additional vinyl ether structure protected with an acetal and is capable of bonding the vinyl ether structure at an arbitrary position other than 1- and 2-positions, Y and R each represents an arbitrary hydrocarbon group and may be straight-chain or branched, Z represents a hydrogen atom or an arbitrary substituent, and Z itself may have an additional vinyl ether structure protected with an acetal, and n represents an integer of 1 to 6, on a to-be-treated substrate;

selectively exposing the formed resist film to imaging radiation capable of provoking decomposition of a photo acid generator of the resist composition, and developing the exposed resist film with an aqueous basic solution.

18. The process according to claim 17, wherein the constituent component having an acetal-protected vinyl ether structure is a film-forming polymer, which is soluble in an aqueous basic solution and has an alkali-soluble group, and the acetal-protected vinyl ether structure is contained in the side chain of the film-forming polymer.

19. The process according to claim 18, wherein the film-forming polymer is an alkali-soluble silicon-containing polymer.

20. The process according to claim 18 or 19, in which said composition comprises the film-forming polymer and a photo acid generator capable of generating an acid that can react with the alkali-soluble group after the acetal-protected vinyl ether structure produces a deacetalization reaction when decomposed as a result of absorption of imaging radiation, wherein the negative resist composition itself is soluble in an aqueous basic solution and the exposed portion becomes insoluble in an alkali after exposure.

21. The process according to claim 17, wherein the constituent component having an acetal-protected vinyl ether structure is a compound containing the acetal-protected vinyl ether structure in its molecule.

22. The process according to claim 21, in which said composition comprises a film-forming polymer having an alkali-soluble group and a combination of the compound containing an acetal-protected vinyl ether structure and a photo acid generator capable of generating an acid that can react with the alkali-soluble group after the acetal-protected vinyl ether structure produces a deacetalization reaction when decomposed as a result of absorption of imaging radiation, wherein the negative resist composition itself is soluble in an aqueous basic solution and the exposed portion becomes insoluble in an alkali after exposure.

23. The process according to claim 20 wherein the alkali-soluble group is selected from the group consisting of phenol group, carboxyl group, N-hydroxyamide group, oxime group, imide group, 1,1,1,3,3,3-hexafluorocarbinol group and sulfonic acid group.

24. The process according to claim 20 wherein the film-forming polymer is formed by polymerizing a monomer selected from the group consisting of acrylic acid, methacrylic acid, itaconic acid, vinylbenzoic acid, norbornene, vinylphenol, styrene and derivatives thereof.

25. The process according to claim 20 wherein the film-forming polymer contains a weak alkali-soluble group selected from the group consisting of a lactone ring, an imide ring and an acid anhydride.

26. The process according to claim 20 wherein the film-forming polymer contains a polycyclic alicyclic hydrocarbon moiety.

27. The process according to claim 26, wherein the polycyclic alicyclic hydrocarbon moiety contains a member selected from the group consisting of an adamanthyl group, a norbornyl group and a bicyclo[2.2.2]octyl group.

28. The process according to claim 27, in which the polycyclic alicyclic hydrocarbon moiety contains at least an alkoxycarbonyl group and/or a ketone group.

29. The process according to claim 17, in which the acetal-protected vinyl ether structure further contains an alicyclic structure and/or a polycyclic alicyclic structure, in addition to the partial structure represented by any one of the above formulas (I) to (III).

30. The process according to claim 20 wherein said composition has an absorbance at a wavelength, of an exposure light source, of 1.75 $\mu m^{-1}$ or less.

31. The process according to claim 20 which said composition contains solvents selected from the group consisting of ethyl lactate, methyl amyl ketone, methyl-3-methoxypropionate, ethyl-3-ethoxypropionate, propylene glycol methyl ether acetate, methyl isobutyl ketone and n-butyl ether alone or in combination.

32. The process according to claim 31, in which said composition further contains a solvent selected from the group consisting of butyl acetate, γ-butyrolactone and propylene glycol methyl ether as an additive solvent.

33. A process for manufacturing an electronic device, which comprises the step of selectively removing an underlying to-be-treated substrate using a resist pattern, formed from the process as recited in claim 17 as a masking means to form a predetermined functional element layer.

34. The process for manufacturing an electronic device according to claim 33, which comprises the following steps of:

applying the negative resist composition on a to-be-treated substrate;

selectively exposing the formed resist film to imaging radiation capable of provoking decomposition of a photo acid generator of the resist composition, developing the exposed resist film with an aqueous basic solution to form a resist pattern by developing the exposed resist film; and selectively removing the treated substrate by etching using the resist pattern as a masking means to form a predetermined functional element layer.

35. The process according to claim 33 wherein the exposure step is carried out through a phase shift mask upon formation of the resist pattern.

36. A process for forming a resist pattern, which comprises the following steps of:

forming the negative resist composition as recited in any one of claims 1 to 3 and 6 on a to-be-treated substrate;

selectively exposing the formed resist film to exposure light having a wavelength of 210 nm or shorter so as to provoke decomposition of a photo acid generator of the resist composition, and developing the exposed resist film with an aqueous basic solution.

37. The process for forming a a resist pattern according to claim 36, wherein the exposure step is carried out using a phase-shift mask.

* * * * *